(12) United States Patent
Kimoto

(10) Patent No.: US 9,806,210 B2
(45) Date of Patent: Oct. 31, 2017

(54) PHOTOELECTRIC CONVERSION ELEMENT

(71) Applicant: Sharp Kabushiki Kaisha, Osaka-shi, Osaka (JP)

(72) Inventor: Kenji Kimoto, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 14/762,880

(22) PCT Filed: Mar. 3, 2014

(86) PCT No.: PCT/JP2014/055264
§ 371 (c)(1),
(2) Date: Jul. 23, 2015

(87) PCT Pub. No.: WO2014/136715
PCT Pub. Date: Sep. 12, 2014

(65) Prior Publication Data
US 2015/0372172 A1   Dec. 24, 2015

(30) Foreign Application Priority Data

Mar. 4, 2013   (JP) .................. 2013-041804

(51) Int. Cl.
*H01L 31/0224*   (2006.01)
*H01L 31/0352*   (2006.01)
(Continued)

(52) U.S. Cl.
CPC ............ *H01L 31/022441* (2013.01); *H01L 31/03529* (2013.01); *H01L 31/03762* (2013.01);
(Continued)

(58) Field of Classification Search
CPC ....... H01L 31/022441; H01L 31/03529; H01L 31/0682; H01L 31/0747; H01L 31/075; Y02E 10/547
(Continued)

(56) References Cited

U.S. PATENT DOCUMENTS 4,415,760 A * 11/1983 Madan .................. H01L 31/075
136/255
2007/0169808 A1 7/2007 Kherani et al.
(Continued)

FOREIGN PATENT DOCUMENTS

CN   102077363 A   5/2011
CN   102725858 A   10/2012
(Continued)

OTHER PUBLICATIONS

WO2011093329A1 Ide et al. Aug. 4, 2011 Solar Cell and Method for Producing Same, English machine translation.*
(Continued)

*Primary Examiner* — Susan D Leong
(74) *Attorney, Agent, or Firm* — Keating & Bennett, LLP

(57) ABSTRACT

A photoelectric conversion element includes a semiconductor, an intrinsic layer disposed on the semiconductor and containing hydrogenated amorphous silicon, a first-conductivity-type layer that covers a part of the intrinsic layer and contains hydrogenated amorphous silicon of a first conductivity type, a second-conductivity-type layer that covers a part of the intrinsic layer and contains hydrogenated amorphous silicon of a second conductivity type, an insulating film covering an end region of the first-conductivity-type layer, a first electrode disposed on the first-conductivity-type layer, and a second electrode disposed on the second-
(Continued)

conductivity-type layer. An end portion of the second-conductivity-type layer is located on the insulating film or above the insulating film.

12 Claims, 16 Drawing Sheets

(51) Int. Cl.
    *H01L 31/0376* (2006.01)
    *H01L 31/075* (2012.01)
    *H01L 31/0747* (2012.01)
    *H01L 31/068* (2012.01)

(52) U.S. Cl.
    CPC ........ *H01L 31/0682* (2013.01); *H01L 31/075* (2013.01); *H01L 31/0747* (2013.01); *Y02E 10/547* (2013.01)

(58) Field of Classification Search
    USPC ................ 136/252, 256, 251, 255, 258, 261
    See application file for complete search history.

(56) References Cited

U.S. PATENT DOCUMENTS

| | | |
|---|---|---|
| 2011/0000532 A1 | 1/2011 | Niira et al. |
| 2012/0012179 A1* | 1/2012 | Asaumi ............ H01L 31/02244 136/256 |
| 2012/0145233 A1* | 6/2012 | Syn ................... H01L 31/02167 136/256 |
| 2013/0186456 A1 | 7/2013 | Ide et al. |
| 2013/0247970 A1 | 9/2013 | Morigami et al. |
| 2014/0000187 A1 | 1/2014 | Botkin et al. |

FOREIGN PATENT DOCUMENTS

| | | | | |
|---|---|---|---|---|
| GB | 2503513 A | * | 1/2014 | ..... H01L 31/022441 |
| JP | 2009-524916 A | | 7/2009 | |
| WO | 2009/096539 A1 | | 8/2009 | |
| WO | 2011/093329 A1 | | 8/2011 | |
| WO | 2011/105554 A1 | | 9/2011 | |

OTHER PUBLICATIONS

Official Communication issued in International Patent Application No. PCT/JP2014/055264, dated Mar. 25, 2014.

* cited by examiner (a)

(b)

(a)

(b)

PHOTOELECTRIC CONVERSION ELEMENT

TECHNICAL FIELD

The present invention relates to photoelectric conversion elements.

BACKGROUND ART

Solar cells that directly convert solar energy to electrical energy have been the subject of rapidly increasing expectations in recent years as next-generation energy sources from the global environmental viewpoint. Solar cells come in a wide variety of types including those that use compound semiconductors or organic materials. Currently, the mainstream solar cells are those which use silicon crystals.

Solar cells that are currently produced and sold in the largest quantity are those which have electrodes formed on a light-receiving surface, which is a surface on which the sunlight is incident, and electrodes formed on a back surface opposite the light-receiving surface.

However, forming electrodes on the light-receiving surface decreases the amount of incident sunlight by an amount corresponding to the area occupied by the electrodes that reflect and absorb the sunlight. Accordingly, development of solar cells in which electrodes are formed on back surfaces is in progress (for example, refer to Japanese Unexamined Patent Application Publication (Translation of PCT Application) No. 2009-524916 (PTL 1)).

FIG. 21 is a schematic cross-sectional view of an amorphous/crystalline silicon heterojunction device described in PTL 1. As illustrated in FIG. 21, in the amorphous/crystalline silicon heterojunction device described in PTL 1, an intrinsic hydrogenated amorphous silicon transition layer 102 is formed on a back surface of a crystalline silicon wafer 101, an n-doped region 103 and a p-doped region 104 of hydrogenated amorphous silicon are formed on the intrinsic hydrogenated amorphous silicon transition layer 102, electrodes 105 are formed on the n-doped region 103 and the p-doped region 104, and an insulating reflection layer 106 is formed between the electrodes 105.

In the amorphous/crystalline silicon heterojunction device described in PTL 1 illustrated in FIG. 21, the n-doped region 103 and the p-doped region 104 are formed by lithography and/or a shadow masking process (for example, refer to paragraph [0020] and the like of PTL 1).

CITATION LIST

Patent Literature

[PTL 1] Japanese Unexamined Patent Application Publication (Translation of PCT Application) No. 2009-524916

SUMMARY OF INVENTION

Technical Problem

In order to form an n-doped region 103 and a p-doped region 104 by lithography, the n-doped region 103 and the p-doped region 104 need to be etched by a process that can increase the etching selectivity ratios of the n-doped region 103 and the p-doped region 104 relative to the intrinsic hydrogenated amorphous silicon transition layer 102. However, PTL 1 is silent as to such an etching process that can increase the etching selectivity ratios.

Since the thickness of the laminate constituted by the intrinsic hydrogenated amorphous silicon transition layer 102 and the n-doped region 103 and the thickness of the laminate constituted by the intrinsic hydrogenated amorphous silicon transition layer 102 and the p-doped region 104 are few angstroms to several tens of nanometers (refer to paragraph [0018] of PTL 1), the thickness of the intrinsic hydrogenated amorphous silicon transition layer 102 is very small. It is extremely difficult to etch the n-doped region 103 and the p-doped region 104 while leaving such a thin intrinsic hydrogenated amorphous silicon transition layer 102 unetched.

In the case where an n-doped region 103 and a p-doped region 104 are formed by a shadow masking process, patterning accuracy is significantly degraded because during formation of the n-doped region 103 and the p-doped region 104 by a plasma CVD (chemical vapor deposition) method, gas reaching behind the mask renders it difficult to separate between the n-doped region 103 and the p-doped region 104; thus, the space between the n-doped region 103 and the p-doped region 104 needs to be large. However, widening the space between the n-doped region 103 and the p-doped region 104 increases the area that does not have the n-doped region 103 or the p-doped region 104, and thus decreases the conversion efficiency of the amorphous/crystalline heterojunction device.

Under the above-described circumstances, an object of the present invention is to provide a photoelectric conversion element that can be manufactured in high yield and has enhanced properties.

Solution to Problem

The present invention provides a photoelectric conversion element that includes a semiconductor; an intrinsic layer disposed on the semiconductor and containing hydrogenated amorphous silicon; a first-conductivity-type layer that covers a part of the intrinsic layer and contains hydrogenated amorphous silicon of a first conductivity type; a second-conductivity-type layer that covers a part of the intrinsic layer and contains hydrogenated amorphous silicon of a second conductivity type; an insulating film covering an end region of the first-conductivity-type layer; a first electrode disposed on the first-conductivity-type layer; and a second electrode disposed on the second-conductivity-type layer, in which an end portion of the second-conductivity-type layer is located on the insulating film or above the insulating film. According to this structure, patterning of the second-conductivity-type layer can be conducted over the insulating film and the damage on the semiconductor, the intrinsic layer, and the first-conductivity-type layer inflicted during patterning of the second-conductivity-type layer can be decreased. Moreover, since the first-conductivity-type layer and the second-conductivity-type layer are insulated from each other in the thickness direction, shunt current can be significantly decreased. Thus, the photoelectric conversion element of the present invention can be manufactured in high yield and can exhibit enhanced properties.

Advantageous Effects of Invention

According to the present invention, a photoelectric conversion element that can be manufactured in high yield and has enhanced properties can be provided.

BRIEF DESCRIPTION OF DRAWINGS

FIG. 20(a) illustrates a cross-sectional structure of a heterojunction-type back-contact cell of Example 2 and FIG. 19(b) is a schematic cross-sectional view taken along XXb-XXb in (a).

DESCRIPTION OF EMBODIMENTS

Figure 1:
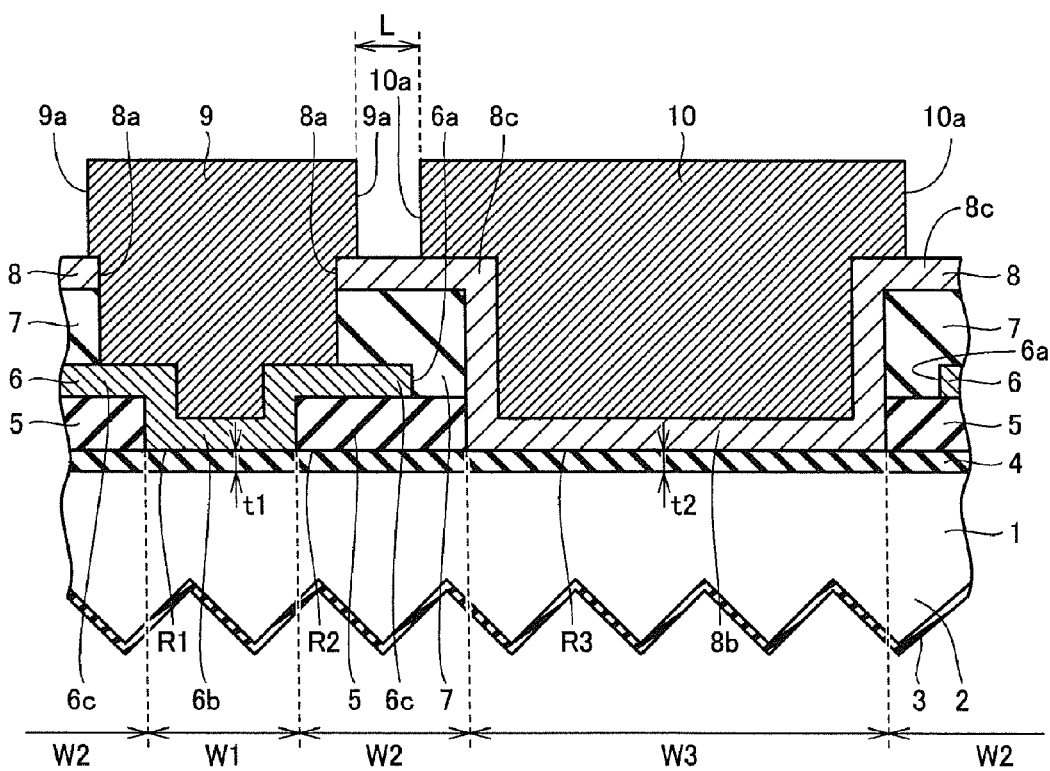
FIG. 1 is a schematic cross-sectional view of a heterojunction-type back-contact cell of Embodiment 1.

Embodiments of the present invention will now be described. In the drawings illustrating the present invention, the same reference signs denote the same or corresponding parts.

Embodiment 1

FIG. 1 is a schematic cross-sectional view of a heterojunction-type back-contact cell according to Embodiment 1 which is an example of a photoelectric conversion element according to the present invention. The heterojunction-type back-contact cell according to Embodiment 1 includes a semiconductor 1 composed of n-type single-crystal silicon, an intrinsic layer 4 that covers the entire back surface of the semiconductor 1 and contains i-type hydrogenated amorphous silicon, an n-type layer 6 that covers a part of the back surface of the intrinsic layer 4 and contains n-type hydrogenated amorphous silicon, a p-type layer 8 that covers a part of the back surface of the intrinsic layer 4 and contains p-type hydrogenated amorphous silicon, and an insulating layer 5 that covers a part of the back surface of the intrinsic layer 4. The n-type layer 6, the p-type layer 8, and the insulating layer 5 respectively cover different regions of the back surface of the semiconductor 1.

The insulating layer 5 has a strip shape. The n-type layer 6 is formed to have a shape that has a groove portion 6b whose recess portion extends in a straight line in a direction normal to the plane of paper of FIG. 1, and a flap portion 6c that extends from upper edges of both side walls of the groove portion 6b toward outside of the groove portion 6b. The p-type layer 8 is formed into a shape that has a groove portion 8b whose recess portion extends in a straight line in the direction normal to the plane of paper of FIG. 1, and a flap portion 8c that extends from upper edges of both side walls of the groove portion 8b toward outside of the groove portion 8b.

A part of the back surface of the insulating layer 5 is covered with the flap portion 6c of the n-type layer 6. Another part of the back surface of the insulating layer 5 is covered with an insulating film 7. A part of the back surface of the flap portion 6c, which is an end region of the n-type layer 6, is covered with the insulating film 7. The entire back surface of the insulating film 7 is covered with the flap portion 8c, which is an end region of the p-type layer 8.

A first electrode 9 fills the groove portion 6b of the n-type layer 6 and covers a part of the back surface of the flap portion 6c. A second electrode 10 fills the groove portion 8b of the p-type layer 8 and covers a part of the back surface of the flap portion 8c. The first electrode 9 also covers a part of the back surface of the flap portion 8c of the p-type layer 8.

An end portion 6a which is an outer end face of the flap portion 6c of the n-type layer 6 and an end portion 8a which is an outer end face of the flap portion 8c of the p-type layer 8 are each located above (on the back surface side of) a region R2 where the intrinsic layer 4 contacts the insulating layer 5. A width W2 of the region R2 where the intrinsic layer 4 contacts the insulating layer 5 can be, for example, 10 μm or more and 300 μm or less.

The end portion 6a of the n-type layer 6 is located on the back surface of the insulating layer 5. The end portion 8a of the p-type layer 8 is located on the back surface of the insulating film 7. Accordingly, the end portion 8a of the p-type layer 8 is located above the end portion 6a of the n-type layer 6 with the insulating film 7 provided therebetween. The end portion 6a of the n-type layer 6 is covered with the insulating film 7.

The first electrode 9 and the second electrode 10 each also has a shape that extends in a straight line in a direction normal to the plane of the paper of FIG. 1, as with the insulating layer 5, the n-type layer 6, the insulating film 7, and the p-type layer 8. An end portion 9a which is an end face in a direction perpendicular to a direction in which the first electrode 9 extends and an end portion 10a which is an end face in a direction perpendicular to a direction in which the second electrode 10 extends are located above the n-type layer 6 on the insulating layer 5.

The thickness of the intrinsic layer 4 in a region R1 where the intrinsic layer 4 contacts the n-type layer 6 is t1. A width W1 of the region R1 where the intrinsic layer 4 contacts the n-type layer 6 can be, for example, 50 μm or more and 500 μm or less.

The thickness of the intrinsic layer 4 in a region R3 where the intrinsic layer 4 contacts the p-type layer 8 is t2. A width W3 of the region R3 where the intrinsic layer 4 contacts the p-type layer 8 can be, for example, 0.6 mm or more and 2 mm or less.

The back-surface-side structure of the semiconductor 1 has the structure described above. A texture structure 2 is formed on the light-receiving surface of the semiconductor 1 opposite the back surface. An antireflection film 3 that also serves as a passivation film is formed on the texture structure 2. The antireflection film 3 may be a laminated film in which an antireflection layer is formed on a passivation layer.

Figure 2:
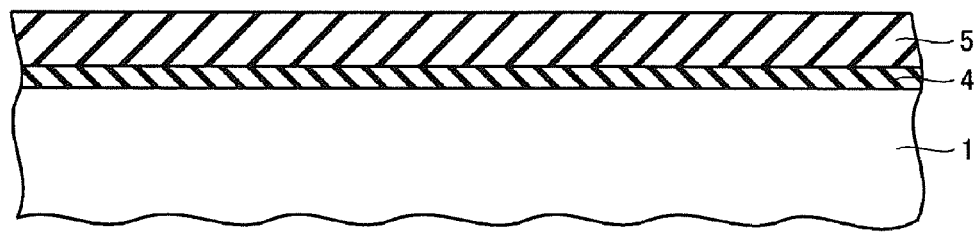
FIG. 2 is a schematic cross-sectional view illustrating an example of a method for manufacturing the heterojunction-type back-contact cell of Embodiment 1.

An example of a method for manufacturing a heterojunction-type back-contact cell of Embodiment 1 will now be described with reference to schematic cross-sectional views of FIGS. 2 to 11. First, as illustrated in FIG. 2, after an intrinsic layer 4 composed of i-type hydrogenated amorphous silicon is deposited by, for example, a plasma CVD method on the entire back surface of a semiconductor 1 subjected to an RCA washing, an insulating layer 5 is formed on the entire back surface of the intrinsic layer 4 by, for example, a plasma CVD method. As described above, a texture structure (not shown) and an antireflection film (not shown) that also serves as a passivation film are formed on the light-receiving surface of the semiconductor 1. For the purposes of this specification, "i-type" means an intrinsic semiconductor.

The semiconductor 1 is not limited to n-type single-crystal silicon. For example, a known semiconductor may be used. The thickness of the semiconductor 1 is not particularly limited and can be, for example, 50 μm or more and 300 μm or less and is preferably 70 μm or more and 150 μm or less. The resistivity of the semiconductor 1 is also not particularly limited and can be, for example, 0.5 Ω·cm or more and 10 Ω·cm or less.

The texture structure on the light-receiving surface of the semiconductor 1 can be formed by, for example, texture-etching the entire light-receiving surface of the semiconductor 1.

The antireflection film that also serves as a passivation film of the light-receiving surface of the semiconductor 1 may be, for example, a silicon nitride film, a silicon oxide film, a laminate of a silicon nitride film and a silicon oxide film, or the like. The thickness of the antireflection film can be, for example, about 100 nm. The antireflection film can be deposited by, for example, a sputtering method or a plasma CVD method.

The thickness of the intrinsic layer 4 formed on the entire back surface of the semiconductor 1 is not particularly limited and may be, for example, 1 nm or more and 10 nm or less. Specifically, the thickness may be about 4 nm.

The insulating layer 5 formed on the entire back surface of the intrinsic layer 4 may be any layer composed of an insulating material. Preferably, the material can be etched substantially without affecting the intrinsic layer 4. The insulating layer 5 may be, for example, a silicon nitride layer, a silicon oxide layer, or a laminate of a silicon nitride layer or a silicon oxide layer formed by a plasma CVD method or the like. In such a case, for example, hydrofluoric acid can be used so as to etch the insulating layer 5 without damaging the intrinsic layer 4. The thickness of the insulating layer 5 is not particularly limited and can be, for example, about 100 nm.

Figure 3:
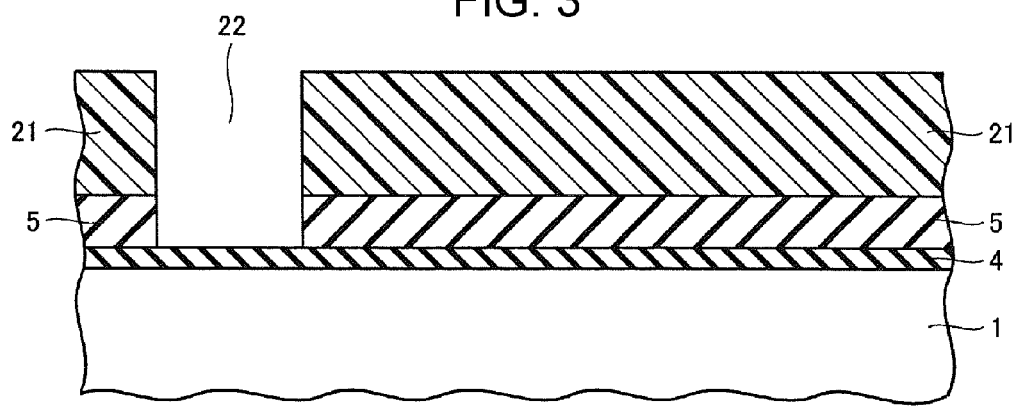
FIG. 3 is a schematic cross-sectional view illustrating an example of a method for manufacturing the heterojunction-type back-contact cell of Embodiment 1.

Next, as illustrated in FIG. 3, a resist 21 having an opening 22 is formed on the back surface of the insulating layer 5. Then a portion of the insulating layer 5 exposed in the opening 22 of the resist 21 is removed to expose the back surface of the intrinsic layer 4 in the opening 22 of the resist 21.

The resist 21 having the opening 22 can be formed by, for example, a photolithographic method, a printing method, or the like. The insulating layer 5 may be removed by wet etching using hydrofluoric acid or the like, etching using an etching paste that contains hydrofluoric acid, or the like. For example, in the case where the insulating layer 5 composed of silicon nitride and/or silicon oxide is removed by wet etching using hydrofluoric acid or the like or by etching using an etching paste containing hydrofluoric acid, hydrogenated amorphous silicon is less susceptible to hydrofluoric acid than silicon nitride and silicon oxide and thus the insulating layer 5 can be selectively removed without substantially affecting the intrinsic layer 4 composed of i-type hydrogenated amorphous silicon. For example, in the case where the insulating layer 5 is wet-etched with hydrofluoric acid having a concentration of about 0.1 to 1%, the wet etching can be stopped at the back surface of the intrinsic layer 4.

Figure 4:
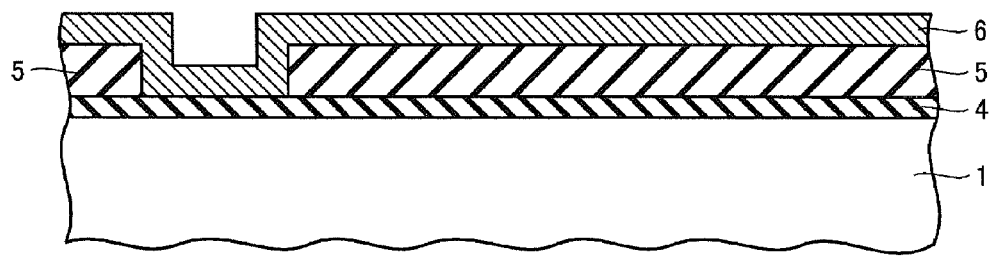
FIG. 4 is a schematic cross-sectional view illustrating an example of a method for manufacturing the heterojunction-type back-contact cell of Embodiment 1.

Subsequently, the resist 21 is completely removed from the back surface of the insulating layer 5. As illustrated in FIG. 4, an n-type layer 6 composed of n-type hydrogenated amorphous silicon is formed by, for example, a plasma CVD method so that the exposed back surface of the intrinsic layer 4 and the insulating layer 5 are covered.

The thickness of the n-type layer 6 that covers the exposed back surface of the intrinsic layer 4 and the insulating layer 5 is not particularly limited and can be, for example, about 10 nm.

The n-type impurity contained in the n-type layer 6 may be, for example, phosphorus, and the n-type impurity concentration in the n-type layer 6 can be, for example, about $5 \times 10^{19}$ atoms/cm$^3$.

Figure 5:
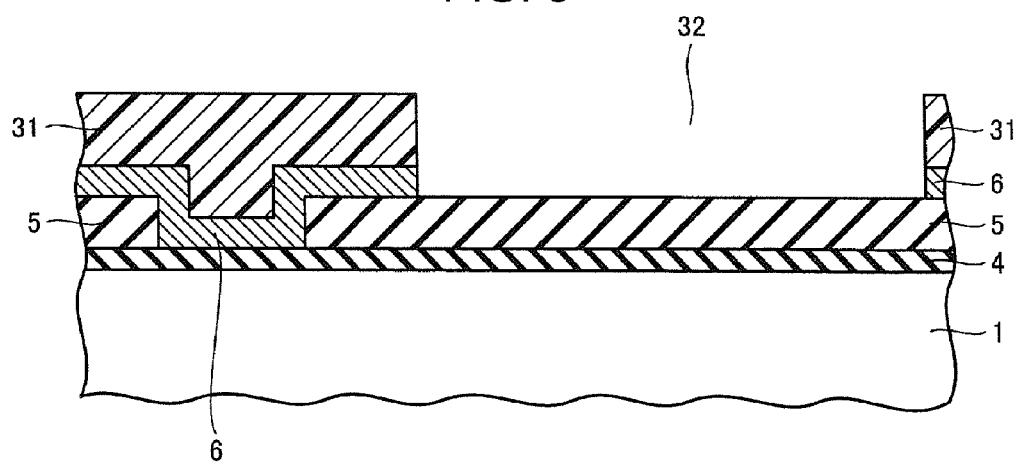
FIG. 5 is a schematic cross-sectional view illustrating an example of a method for manufacturing the heterojunction-type back-contact cell of Embodiment 1.

Next, as illustrated in FIG. 5, a resist 31 having an opening 32 is formed on the back surface of the n-type layer 6. Then a portion of the n-type layer 6 exposed in the opening 32 of the resist 31 is removed so as to expose the back surface of the insulating layer 5 in the opening 32 of the resist 31.

The resist 31 having the opening 32 can be formed by, for example, a photolithographic method, a printing method, or the like. The n-type layer 6 can be selectively removed by, for example, wet etching using an aqueous alkaline solution having a concentration of about 0.1% to 5%, such as an aqueous tetramethylammonium hydroxide solution, an aqueous potassium hydroxide solution, or an aqueous sodium hydroxide solution, without substantially affecting the intrinsic layer 4.

Figure 6:
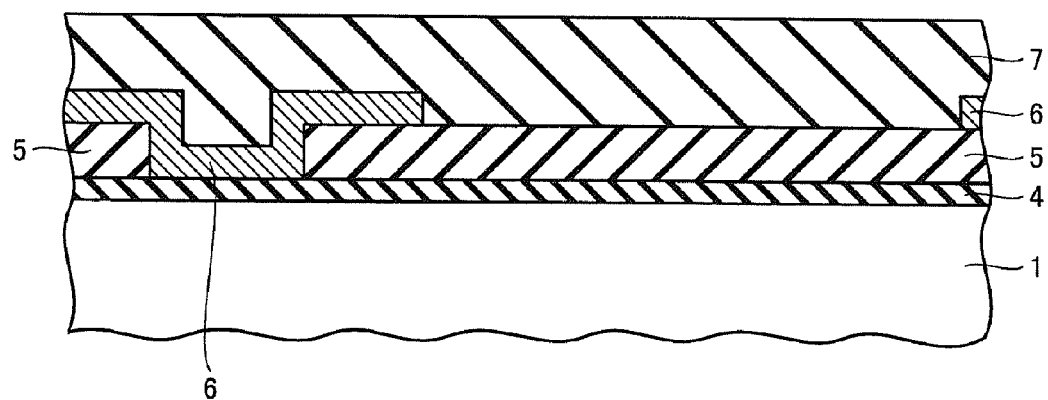
FIG. 6 is a schematic cross-sectional view illustrating an example of a method for manufacturing the heterojunction-type back-contact cell of Embodiment 1.

After the resist 31 is completely removed from the back surface of the n-type layer 6, an insulating film 7 is formed by, for example, a plasma CVD method, so as to cover the exposed back surface of the insulating layer 5 and the n-type layer 6 as illustrated in FIG. 6.

The insulating film 7 may be any layer composed of an insulating material. For example, a silicon nitride layer, a silicon oxide layer, a laminate of a silicon nitride layer and a silicon oxide layer, or the like can be used. The thickness of the insulating film 7 is not particularly limited and can be, for example, 100 nm or more and 1,000 nm or less.

Figure 7:
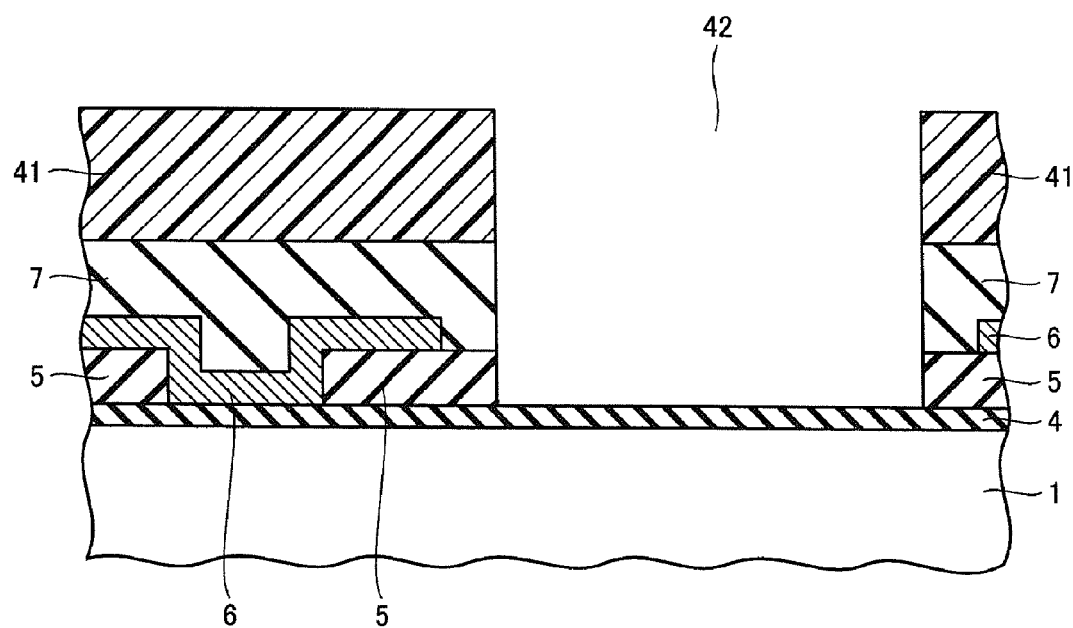
FIG. 7 is a schematic cross-sectional view illustrating an example of a method for manufacturing the heterojunction-type back-contact cell of Embodiment 1.

Next, as illustrated in FIG. 7, a resist 41 having an opening 42 is formed on the back surface of the insulating film 7. Then a portion of the insulating film 7 exposed in the opening 42 of the resist 41 and a portion of the insulating layer 5 directly below are removed so as to expose the back surface of the intrinsic layer 4 in the opening 42 of the resist 41.

The resist 41 having the opening 42 can be formed by, for example, a photolithographic method, a printing method, or the like. The insulating film 7 and the insulating layer 5 can be removed by, for example, wet etching using hydrofluoric acid or by etching using an etching paste containing hydrofluoric acid. In the case where the insulating layer 5 and the insulating film 7 each composed of silicon nitride and/or silicon oxide are removed by wet etching using hydrofluoric acid or the like or by etching using an etching paste containing hydrofluoric acid, hydrogenated amorphous silicon is less susceptible to hydrofluoric acid than silicon nitride and silicon oxide and thus the insulating layer 5 and the insulating film 7 can be selectively removed without substantially affecting the intrinsic layer 4 composed of i-type hydrogenated amorphous silicon.

Figure 8:
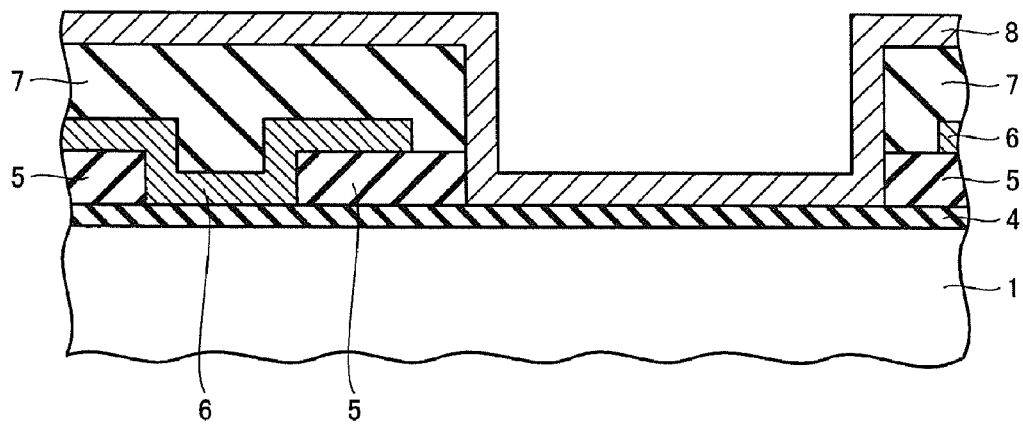
FIG. 8 is a schematic cross-sectional view illustrating an example of a method for manufacturing the heterojunction-type back-contact cell of Embodiment 1.

After the resist 41 is completely removed from the back surface of the insulating film 7, a p-type layer 8 composed of p-type hydrogenated amorphous silicon is formed by, for example, a plasma CVD method so as to cover the exposed back surface of the intrinsic layer 4 and the laminate that includes the insulating layer 5, the n-type layer 6, and the insulating film 7, as illustrated in FIG. 8.

The thickness of the p-type layer 8 is not particularly limited and can be, for example, about 10 nm.

The p-type impurity contained in the p-type layer 8 can be, for example, boron. The p-type impurity concentration in the p-type layer 8 can be, for example, about $5 \times 10^{19}$ atoms/cm$^3$.

Figure 9:
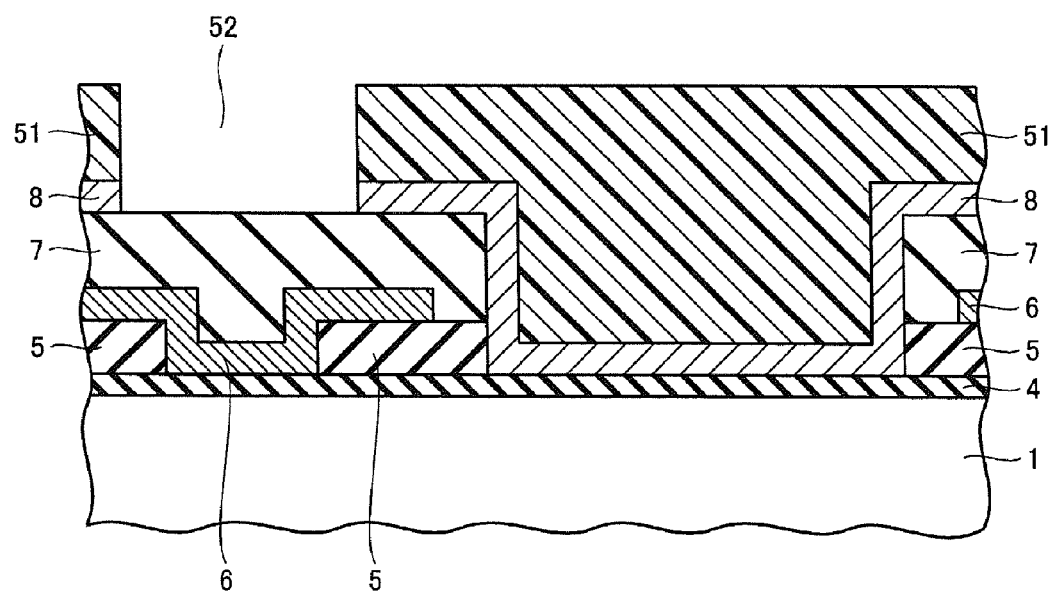
FIG. 9 is a schematic cross-sectional view illustrating an example of a method for manufacturing the heterojunction-type back-contact cell of Embodiment 1.

Next, as illustrated in FIG. 9, a resist 51 having an opening 52 is formed on the back surface of the p-type layer 8. Then a portion of the p-type layer 8 exposed in the opening 52 of the resist 51 is removed.

The resist 51 having the opening 52 can be formed by, for example, a photolithographic method, a printing method, or the like. The p-type layer 8 can be removed by, for example, wet etching using a mixture of hydrofluoric acid and nitric acid.

In the case where the p-type layer 8 is wet-etched by using a mixture of hydrofluoric acid and nitric acid, the hydrofluoric acid/nitric acid mixing ratio (volume ratio) can be, for example, hydrofluoric acid:nitric acid=1:100. Wet-etching of the p-type layer 8 is preferably conducted slowly or by using a sufficiently thick insulating film 7 so as not completely remove the insulating film 7 directly below the p-type layer 8 and expose the back surface of the n-type layer 6.

Figure 10:
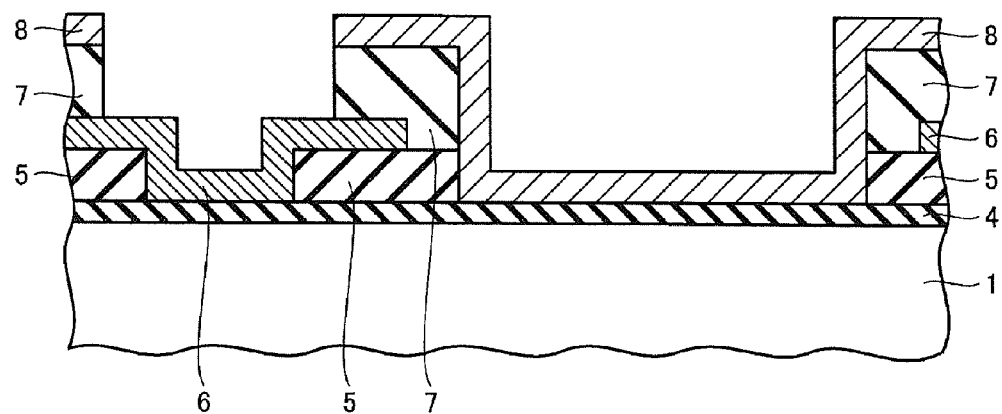
FIG. 10 is a schematic cross-sectional view illustrating an example of a method for manufacturing the heterojunction-type back-contact cell of Embodiment 1.

Next, as illustrated in FIG. 10, a portion of the insulating film 7 exposed in the opening 52 of the resist 51 is removed to expose the back surface of the n-type layer 6, and then the resist 51 is completely removed. The insulating film 7 can be removed by, for example, wet etching using hydrofluoric acid or the like or by etching using an etching paste. For example, when the insulating film 7 composed of silicon nitride and/or silicon oxide is removed by wet etching using hydrofluoric acid or the like or by etching using an etching paste containing hydrofluoric acid, hydrogenated amorphous silicon is less susceptible to hydrofluoric acid than silicon nitride and silicon oxide and thus the insulating film 7 can be selectively removed without substantially affecting the n-type layer 6 composed of n-type hydrogenated amorphous silicon.

Figure 11:
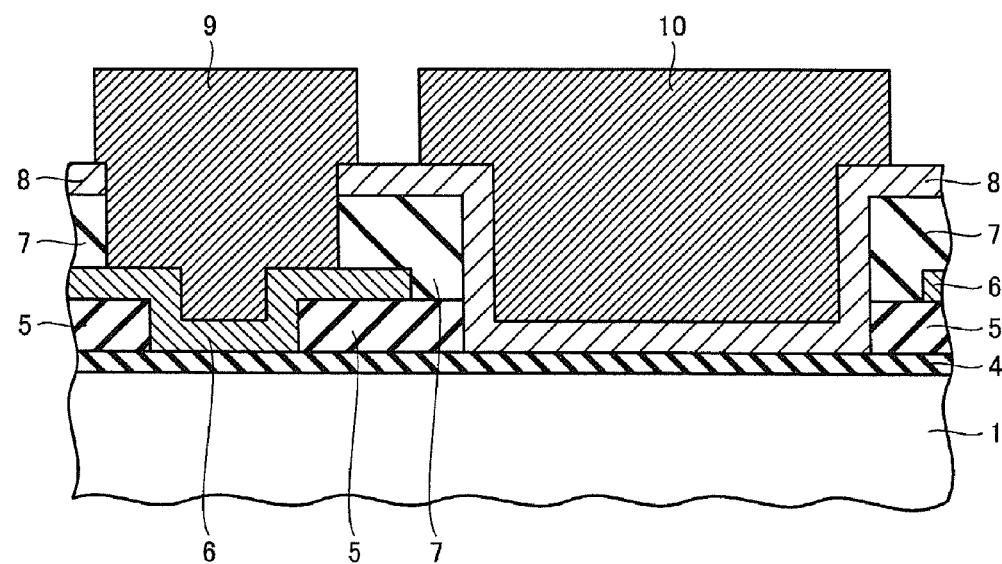
FIG. 11 is a schematic cross-sectional view illustrating an example of a method for manufacturing the heterojunction-type back-contact cell of Embodiment 1.

Then, as illustrated in FIG. 11, a first electrode 9 is formed on the back surface of the n-type layer 6 and a second electrode 10 is formed on the back surface of the p-type layer 8.

The material for the first electrode 9 and the second electrode 10 is not particularly limited and can be any material that has electrical conductivity. In particular, at least one of aluminum and silver is preferably used. Aluminum and silver have high reflectance for light in the long-wavelength region and thus sensitivity of the semiconductor 1 for light in the long-wavelength region can be improved and the semiconductor 1 can be made thin.

The thickness of the first electrode 9 and the thickness of the second electrode 10 are not particularly limited, and can be, for example, 0.5 μm or more and 10 μm or less.

The method for forming the first electrode 9 and the second electrode 10 is not particularly limited. For example, application and baking of a conductive paste, a vapor deposition method, or the like can be used. A vapor deposition method is preferably used. In the case where the first electrode 9 and the second electrode 10 are formed by a vapor deposition method, the reflectance for light that has passed through the semiconductor 1 can be increased compared to the case where application and baking of a conductive paste are conducted; hence, properties such as short-circuit current density, F.F, and conversion efficiency of the heterojunction-type back-contact cell of Embodiment 1 can be improved.

The heterojunction-type back-contact cell of Embodiment 1 can be manufactured as described above.

As described above, in Embodiment 1, patterning of the n-type layer 6 and the p-type layer 8 can be conducted over the insulating layer 5 and the insulating film 7, respectively. As a result, damage on the semiconductor 1 and the intrinsic layer 4 inflicted during patterning of the n-type layer 6 and the p-type layer 8 can be decreased, heterojunction-type back-contact cells can be manufactured in high yield, and properties thereof can be enhanced.

In Embodiment 1, the first electrode 9 and the second electrode 10 can be formed so that the interelectrode distance L between the end portion 9a of the first electrode 9 and the end portion 10a of the second electrode 10 that are adjacent to and opposing each other is small. Accordingly, the amount of light that has entered the light-receiving surface of the semiconductor 1, has passed through the semiconductor 1, and is passing through the gap between the first electrode 9 and the second electrode 10 can be decreased, and the amount of light reflected toward the semiconductor 1 side can be increased. Thus, the properties of the heterojunction-type back-contact cell can be enhanced.

According to Embodiment 1, there is no need to use a shadow masking process to form the n-type layer 6 and the p-type layer 8. Thus, the n-type layer 6 and the p-type layer 8 can be formed highly accurately, heterojunction-type back-contact cells can be manufactured in high yield, and properties thereof can be enhanced.

In particular, in Embodiment 1, the end portion 6a of the n-type layer 6 and the end portion 8a of the p-type layer 8 are located above the insulating layer 5 in the region R2 where the intrinsic layer 4 contacts the insulating layer 5. Accordingly, patterning of the n-type layer 6 and the p-type layer 8 can be conducted over the insulating layer 5 and thus damage on the semiconductor 1 and the intrinsic layer 4 inflicted during patterning of the n-type layer 6 and the p-type layer 8 can be decreased.

In Embodiment 1, the end portion 8a of the p-type layer 8 is located above the end portion 6a of the n-type layer 6 with the insulating film 7 therebetween. Accordingly, the n-type layer 6 and the p-type layer 8 can be insulated from each other by the insulating film 7 in the thickness direction. Since the insulating film 7 is disposed between the n-type layer 6 and the p-type layer 8, patterning of the p-type layer 8 can be conducted without damaging the n-type layer 6.

In Embodiment 1, the end portion 9a of the first electrode 9 and the end portion 10a of the second electrode 10 are located on the insulating film 7. Thus, patterning of the first electrode 9 and the second electrode 10 can be conducted over the insulating film 7 and damage on the semiconductor 1, the intrinsic layer 4, the n-type layer 6, and the p-type layer 8 inflicted during patterning of the first electrode 9 and the second electrode 10 can be decreased. In this case, the interelectrode distance L between the end portion 9a of the first electrode 9 and the end portion 10a of the second electrode 10 that are adjacent to and opposing each other can be decreased, the amount of light passing through the gap between the first electrode 9 and the second electrode 10 is decreased, and the amount of light reflected toward the semiconductor 1 side can be increased. Thus, properties of the heterojunction-type back-contact cell can be improved.

In Embodiment 1, the end portion 9a of the first electrode 9 and the end portion 10a of the second electrode 10 are located on the p-type layer 8 disposed on the insulating film 7. Since patterning of the first electrode 9 and the second electrode 10 can be conducted over the insulating film 7 due to this structure, damage on the semiconductor 1, the intrinsic layer 4, the n-type layer 6, and the p-type layer 8 on the region R3 inflicted during patterning of the first electrode 9 and the second electrode 10 can be decreased. Moreover, in such a case, the interelectrode distance L between the end portion 9a of the first electrode 9 and the end portion 10a of the second electrode 10 that are adjacent to and opposing each other can be decreased, the amount of light passing through the gap between the first electrode 9 and the second electrode 10 is decreased, and the amount of light reflected toward the semiconductor 1 side can be increased. Thus, properties of the heterojunction-type back-contact cell can be improved.

In Embodiment 1, the p-type layer 8 preferably has a conductivity of 0.28 S/cm or less. In such a case, the interelectrode distance L between the first electrode 9 and the second electrode 10 can be decreased to 10 μm or less, the amount of light passing through the gap between the first electrode 9 and the second electrode 10 is decreased, and the amount of light reflected toward the semiconductor 1 side can be increased. Thus, properties of the heterojunction-type back-contact cell can be improved.

In Embodiment 1, the p-type layer 8 is formed after formation of the n-type layer 6; thus, a satisfactory passivation effect can be obtained at the back surface of the semiconductor 1 due to the intrinsic layer 4. In other words, if the p-type layer 8 is formed before the n-type layer 6 is formed, the passivation properties obtained by the intrinsic layer 4 coated with the p-type layer 8 are degraded by the effect of annealing conducted in forming the n-type layer 6, and effective minority carrier lifetime in the semiconductor 1 may decrease. However, if the p-type layer 8 is formed after formation of the n-type layer 6, the decrease in the effective minority carrier lifetime can be decreased.

In Embodiment 1, the thickness t2 of the intrinsic layer 4 in the region R3 in contact with the p-type layer 8 is preferably larger than the thickness t1 of the intrinsic layer 4 in the region R1 in contact with the n-type layer 6. When the thickness t2 of the intrinsic layer 4 directly below the p-type layer 8 is larger than the thickness t1 of the intrinsic layer 4 directly below the n-type layer 6, a better passivation effect can be obtained at the back surface of the semiconductor 1 by the intrinsic layer 4.

In the description above, the first conductivity type is assumed to be the n type and the second conductivity type is assumed to be the p-type. Alternatively, the first conductivity type may be assumed to be the p-type and the second conductivity type may be assumed to be the n type, naturally.

Embodiment 2

Figure 12:
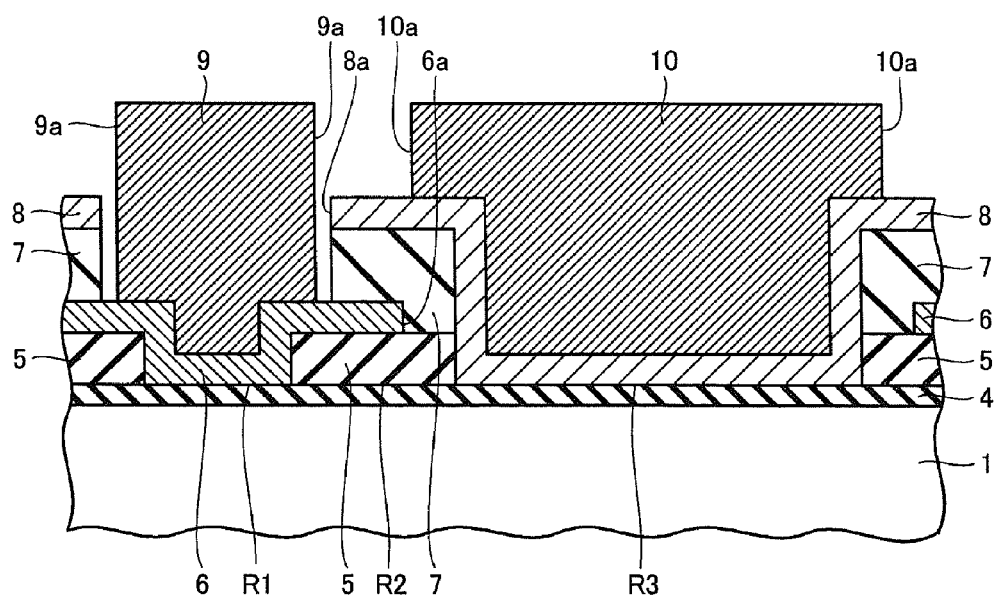
FIG. 12 is a schematic cross-sectional view of a heterojunction-type back-contact cell of Embodiment 2.

FIG. 12 is a schematic cross-sectional view of a heterojunction-type back-contact cell according to Embodiment 2 which is another example of a photoelectric conversion element of the present invention. The heterojunction-type back-contact cell of Embodiment 2 is characterized in that the end portion 9a of the first electrode 9 is located on the back surface of the n-type layer 6 while the end portion 10a of the second electrode 10 is located on the back surface of the p-type layer 8.

In Embodiment 2 also, the end portion 6a of the n-type layer 6 and the end portion 8a of the p-type layer 8 are located above the insulating layer 5 in the region R2 where the intrinsic layer 4 contacts the insulating layer 5, and patterning of the n-type layer 6 and the p-type layer 8 can be conducted over the insulating layer 5. Accordingly, in Embodiment 2 also, damage on the semiconductor 1 and the intrinsic layer 4 can be decreased, heterojunction-type back-contact cells can be manufactured in high yield, and properties thereof can be enhanced. Moreover, since the n-type layer 6 and the p-type layer 8 are insulated from each other by the insulating film 7 in the thickness direction, shunt current is prevented from flowing between the first electrode 9 and the second electrode 10.

Since features of Embodiment 2 other than those described above are identical to those of Embodiment 1, the description therefor is omitted.

Embodiment 3

Figure 13:
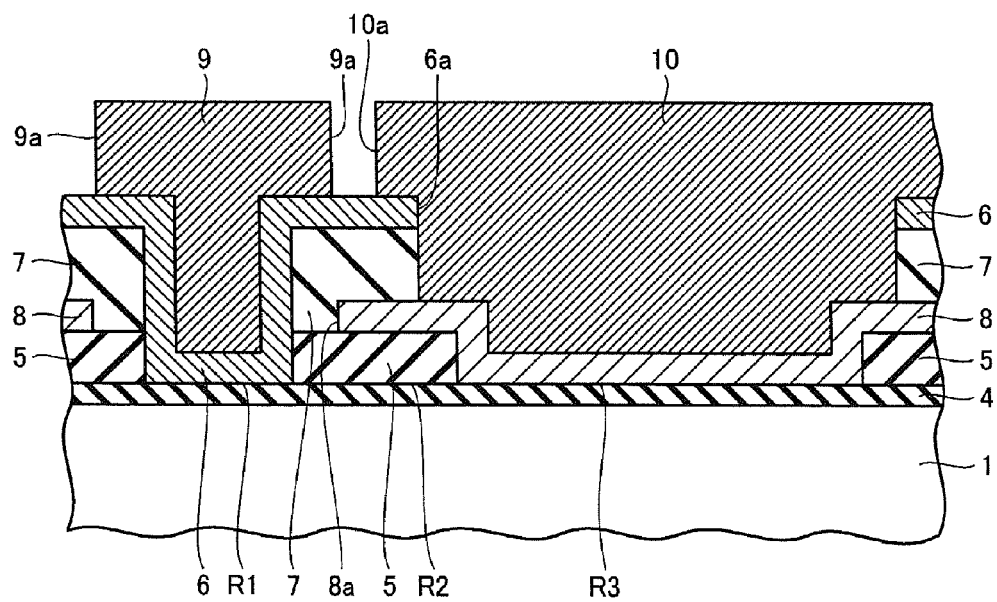
FIG. 13 is a schematic cross-sectional view of a heterojunction-type back-contact cell of Embodiment 3.

FIG. 13 is a schematic cross-sectional view of a heterojunction-type back-contact cell according to Embodiment 3 which is another example of a photoelectric conversion element of the present invention. The heterojunction-type back-contact cell of Embodiment 3 is characterized in that the n-type layer 6 is formed after formation of the p-type layer 8.

In Embodiment 3 also, the end portion 6a of the n-type layer 6 and the end portion 8a of the p-type layer 8 are located above the insulating layer 5 in the region R2 where the intrinsic layer 4 contacts the insulating layer 5, and thus patterning of the n-type layer 6 and the p-type layer 8 can be conducted over the insulating layer 5. Accordingly, in Embodiment 3 also, damage on the semiconductor 1 and the intrinsic layer 4 can be decreased, heterojunction-type back-contact cells can be manufactured in high yield, and properties thereof can be enhanced. Moreover, since the n-type layer 6 and the p-type layer 8 are insulated from each other by the insulating film 7 in the thickness direction, shunt current is prevented from flowing between the first electrode 9 and the second electrode 10.

Since features of Embodiment 3 other than those described above are identical to those of Embodiments 1 and 2, the description therefor is omitted.

Embodiment 4

Figure 14:
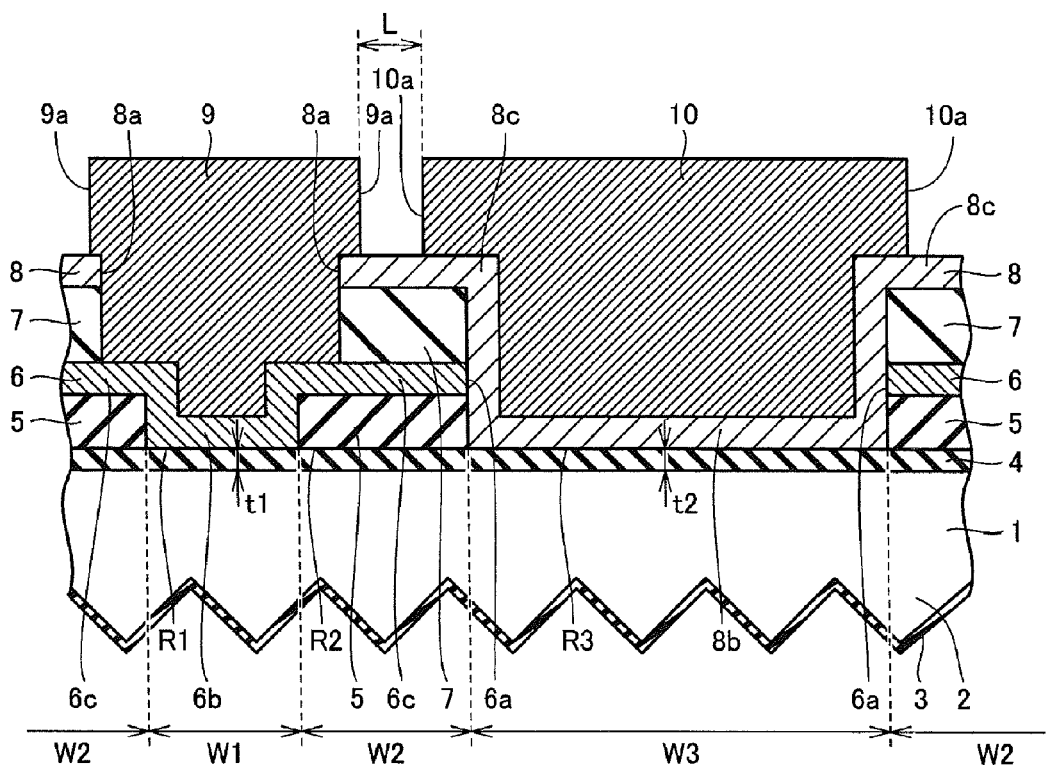
FIG. 14 is a schematic cross-sectional view of a heterojunction-type back-contact cell of Embodiment 4.

FIG. 14 is a schematic cross-sectional view of a heterojunction-type back-contact cell according to Embodiment 4 which is another example of a photoelectric conversion element of the present invention. The heterojunction-type back-contact cell of Embodiment 4 is characterized in that the end portion 6a of the n-type layer 6 is in contact with the p-type layer 8.

An example of a method for manufacturing the heterojunction-type back-contact cell of Embodiment 4 will now be described with reference to schematic cross-sectional views of FIGS. 15 to 18. First, as illustrated in FIGS. 2 to 4, an intrinsic layer 4 and an insulating layer 5 are formed on a back surface of a semiconductor 1 in this order by, for example, a plasma CVD method, a resist 21 having an opening 22 is formed on the back surface of the insulating layer 5, a portion of the insulating layer 5 exposed in the opening 22 is removed, and an n-type layer 6 is formed so as to cover the exposed back surface of the intrinsic layer 4 and the insulating layer 5. The process up to here is identical to that of Embodiment 1.

Figure 15:
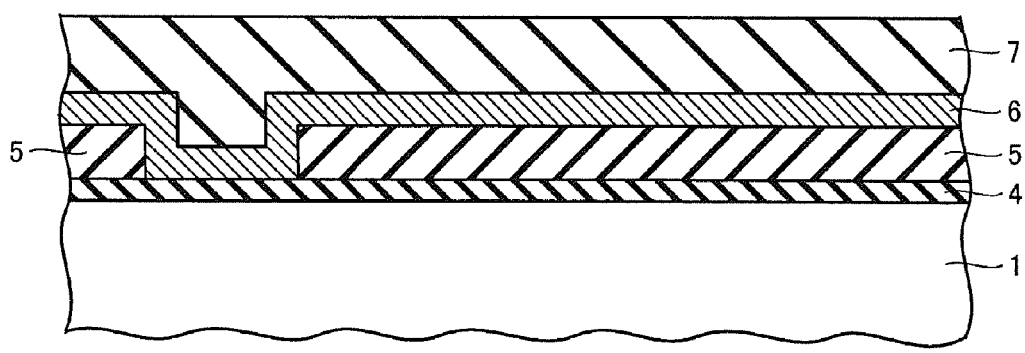
FIG. 15 is a schematic cross-sectional view illustrating an example of a method for manufacturing the heterojunction-type back-contact cell of Embodiment 4.
Figure 16:
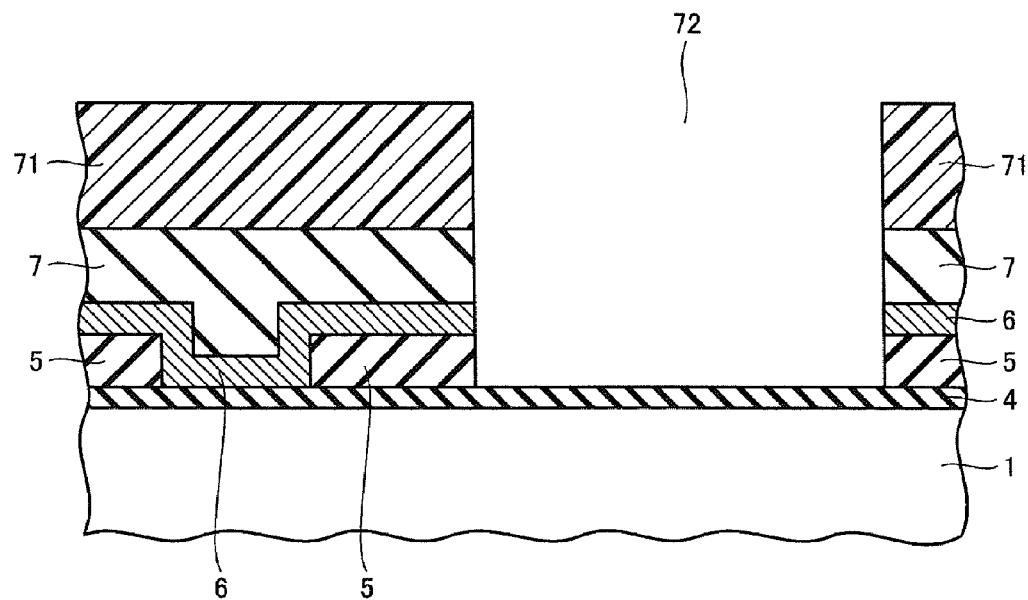
FIG. 16 is a schematic cross-sectional view illustrating an example of a method for manufacturing the heterojunction-type back-contact cell of Embodiment 4.

Next, as illustrated in FIG. 15, an insulating film 7 is formed on the entire back surface of the n-type layer 6. Next, as illustrated in FIG. 16, a resist 71 having an opening 72 is formed on the back surface of the insulating film 7 and then portions of the insulating film 7, the n-type layer 6, and the insulating layer 5 exposed in the opening 72 are removed to expose the back surface of the intrinsic layer 4.

The insulating film 7 may be removed by, for example, wet etching by using an etching solution having a higher etching rate than that for the n-type layer 6. This etching solution may be, for example, hydrofluoric acid having a concentration of about 0.1 to 1%.

The n-type layer 6 may be removed by, for example, wet etching by using an etching solution having a higher etching rate than that for the insulating layer 5. This etching solution may be, for example, an aqueous tetramethylammonium hydroxide solution or an aqueous potassium hydroxide solution.

The insulating layer 5 may be removed by, for example, wet etching by using an etching solution having a higher etching rate than that for the intrinsic layer 4. This etching solution may be, for example, hydrofluoric acid having a concentration of about 0.5 to 1%.

Figure 17:
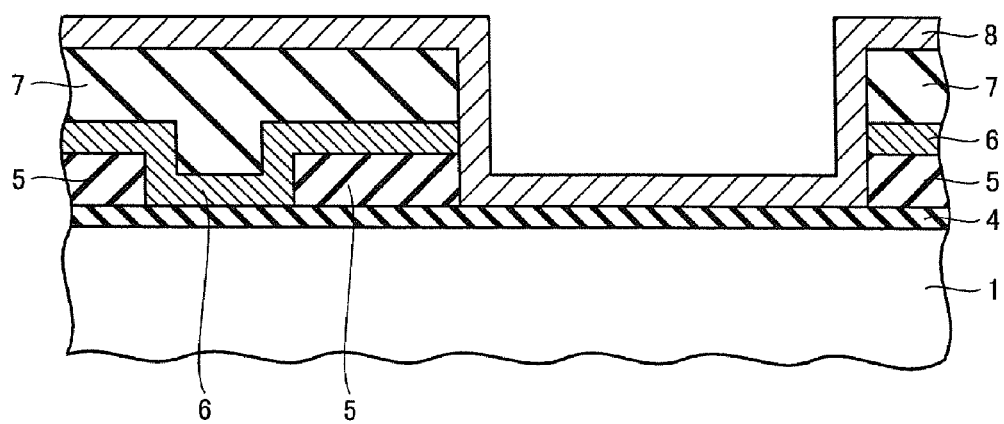
FIG. 17 is a schematic cross-sectional view illustrating an example of a method for manufacturing the heterojunction-type back-contact cell of Embodiment 4.

After the resist 41 is completely removed from the back surface of the insulating film 7, a p-type layer 8 is formed by, for example, a plasma CVD method so as to cover the laminate that includes the insulating layer 5, the n-type layer 6, and the insulating film 7, and the exposed back surface of the intrinsic layer 4, as illustrated in FIG. 17. An intrinsic layer composed of i-type hydrogenated amorphous silicon may be formed before forming the p-type layer 8. In such a case, the thickness of the intrinsic layer directly below the p-type layer 8 can be made larger than the thickness of the intrinsic layer directly below the n-type layer 6; thus, a satisfactory passivation effect can be obtained at the back surface of the semiconductor 1 by the intrinsic layer.

Figure 18:
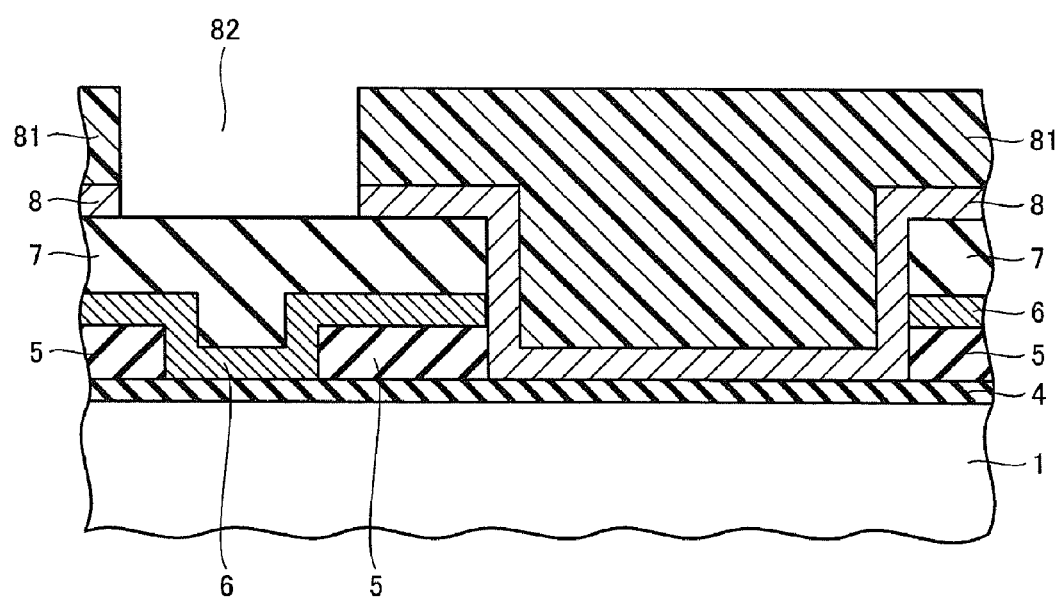
FIG. 18 is a schematic cross-sectional view illustrating an example of a method for manufacturing the heterojunction-type back-contact cell of Embodiment 4.

Next, as illustrated in FIG. 18, a resist 81 having an opening 82 is formed on the back surface of the p-type layer 8. Portions of the p-type layer 8 and the insulating film 7 exposed in the opening 82 are removed to expose the back surface of the n-type layer 6.

The p-type layer 8 may be removed by, for example, wet etching by using a mixture of hydrofluoric acid and nitric acid. In the case where the p-type layer 8 is to be wet etched by using a mixture of hydrofluoric acid and nitric acid, the hydrofluoric acid/nitric acid mixing ratio (volume ratio) can be, for example, hydrofluoric acid:nitric acid=1:100. Wet-etching of the p-type layer 8 is preferably conducted slowly or by using a sufficiently thick insulating film 7 so as not completely remove the insulating film 7 directly below the p-type layer 8 and expose the back surface of the n-type layer 6.

The insulating film 7 may be removed by, for example, wet etching by using an etching solution having a higher etching rate than that for the n-type layer 6. This etching solution may be, for example, hydrofluoric acid having a concentration of about 0.1 to 1%.

After the resist 81 is removed from the back surface of the p-type layer 8, a first electrode 9 is formed on the back surface of the n-type layer 6 and a second electrode 10 is formed on the back surface of the p-type layer 8, as illustrated in FIG. 14.

The first electrode 9 and the second electrode 10 may each be formed of, for example, a laminate film obtained by forming an ITO (indium tin oxide) film by a vapor deposition method, an ion plating method, a sputtering method, or the like, and then forming a metal film such as an aluminum or silver film thereon. Alternatively, the first electrode 9 and the second electrode 10 may each be formed of a single-layer metal film. Patterning of the metal film can be conducted by, for example, a lithographic method, a printing method, or the like. Alternatively, patterning of the metal film may be conducted by using a laser beam.

The heterojunction-type back-contact cell of Embodiment 4 can be manufactured as described above.

The heterojunction-type back-contact cell of Embodiment 4 includes a portion where the end portion 6a of the n-type layer 6 contacts the p-type layer 8. However, since the thickness of the n-type layer 6 is significantly small, the shunt resistance component is significantly increased and thus properties of the heterojunction-type back-contact cell of Embodiment 4 remain unaffected.

In Embodiment 4 also, the end portion 6a of the n-type layer 6 and the end portion 8a of the p-type layer 8 are located above the insulating layer 5 in the region R2 where the intrinsic layer 4 contacts the insulating layer 5. Accordingly, patterning of the n-type layer 6 and the p-type layer 8 can be conducted over the insulating layer 5. Thus, in Embodiment 4 also, damage on the semiconductor 1 and the intrinsic layer 4 can be decreased, heterojunction-type back-contact cells can be manufactured in high yield, and properties thereof can be enhanced.

Compared with Embodiments 1 to 3, Embodiment 4 involves a simplified manufacturing process.

Described below are other aspects of the present invention, namely, a photoelectric conversion module (Embodiment 5) and solar power generation systems (Embodiments 6 and 7) equipped with the heterojunction-type back-contact cells of Embodiments 1 to 4.

Since the heterojunction-type back-contact cells of Embodiments 1 to 4 have enhanced properties, the photoelectric conversion module and the solar power generation systems equipped with the heterojunction-type back-contact cells also have enhanced properties.

Embodiment 5

Embodiment 5 is a photoelectric conversion module that uses the heterojunction-type back-contact cells of Embodiments 1 to 4 as photoelectric conversion elements.
<Photoelectric Conversion Module>

Figure 22:
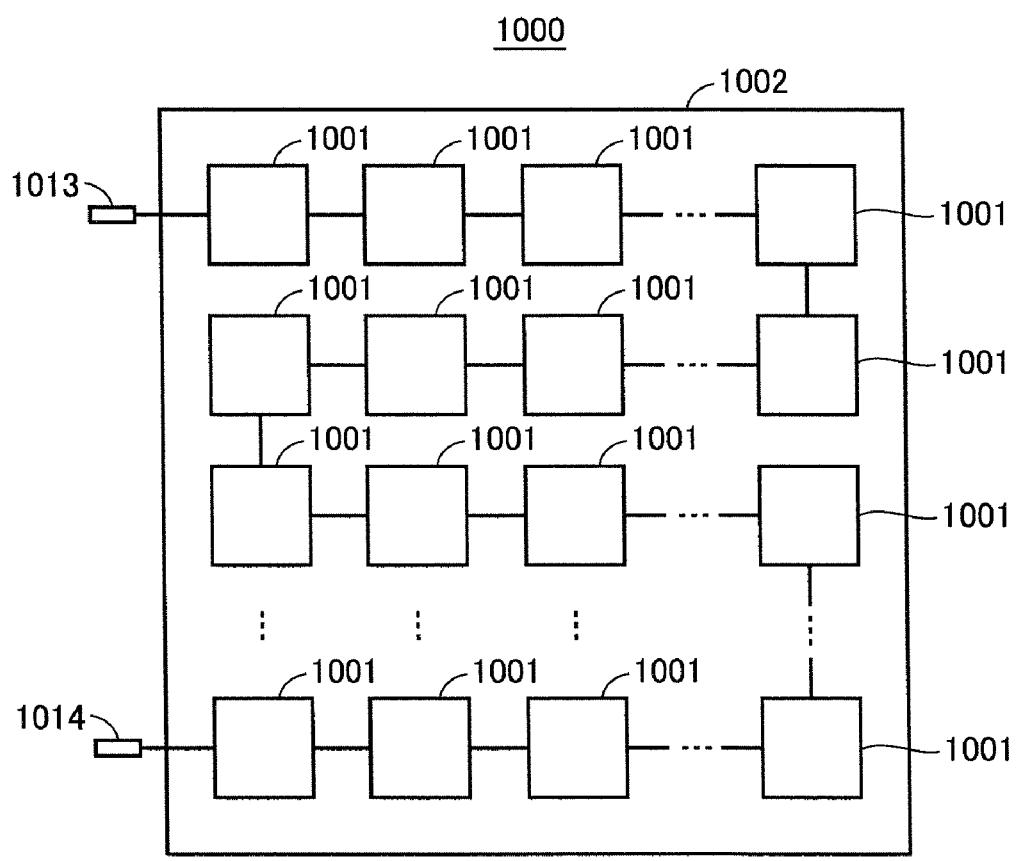
FIG. 22 is a schematic diagram of a structure of a photoelectric conversion module of Embodiment 5.

FIG. 22 is a schematic diagram illustrating a structure of a photoelectric conversion module according to Embodiment 5 which is an example of a photoelectric conversion module of the present invention that uses heterojunction-type back-contact cells of Embodiments 1 to 4 as photoelectric conversion elements. Referring to FIG. 22, a photoelectric conversion module 1000 of Embodiment 5 includes plural photoelectric conversion elements 1001, a cover 1002, and output terminals 1013 and 1014.

The photoelectric conversion elements 1001 are arranged into an array and connected in series. FIG. 22 illustrates an arrangement in which the photoelectric conversion elements 1001 are connected in series but the arrangement and the connection mode are not limited to these. The elements may be connected in parallel or both in series and in parallel. The photoelectric conversion elements 1001 are each one of the heterojunction-type back-contact cells of Embodiments 1 to 4. The number of photoelectric conversion elements 1001 included in the photoelectric conversion module 1000 can be any integer equal to or greater than 2.

The cover 1002 is formed of a weatherproof cover and covers the photoelectric conversion elements 1001.

The output terminal 1013 is connected to the photoelectric conversion element 1001 arranged at one end of the photoelectric conversion elements 1001 connected in series.

The output terminal 1014 is connected to the photoelectric conversion element 1001 arranged at the other end of the photoelectric conversion element 1001 connected in series.

Embodiment 6

Embodiment 6 is a solar power generation system that uses heterojunction-type back-contact cells of Embodiments 1 to 4 as photoelectric conversion elements.
<Solar Power Generation System>

A solar power generation system is an apparatus that appropriately converts power output from the photoelectric conversion modules so that the power can be used as commercial power or supplied to electrical appliances etc.

Figure 23:
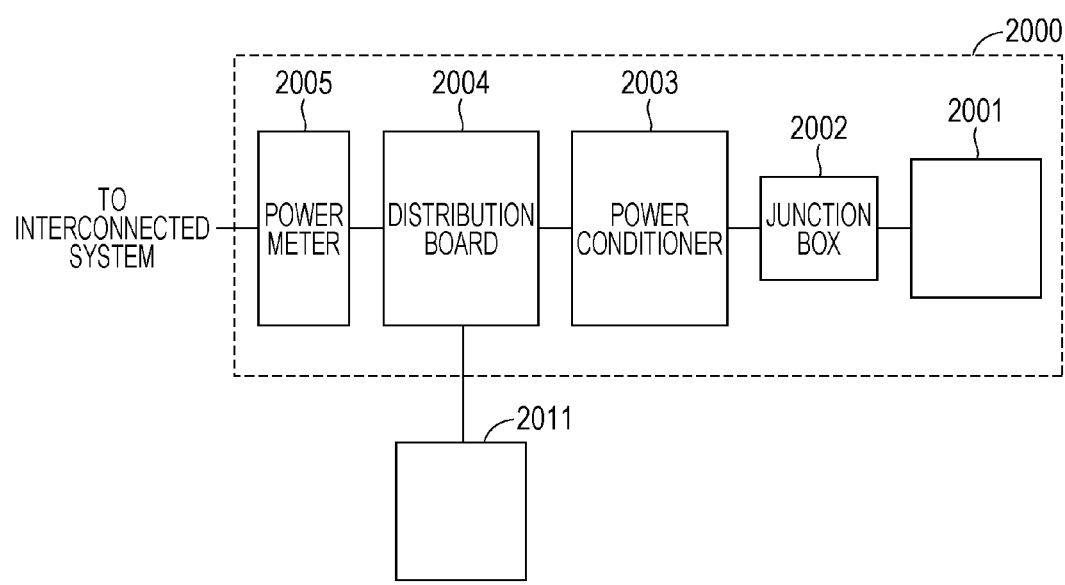
FIG. 23 is a schematic diagram of a structure of a solar power generation system of Embodiment 6.

FIG. 23 is a schematic diagram illustrating a structure of a solar power generation system of Embodiment 6 which is an example of a solar power generation system of the present invention in which heterojunction-type back-contact cells of Embodiments 1 to 4 are used as photoelectric conversion elements. Referring to FIG. 23, a solar power generation system 2000 of Embodiment 6 includes a photoelectric conversion module array 2001, a junction box 2002, a power conditioner 2003, a distribution board 2004, and a power meter 2005. As described below, the photoelectric conversion module array 2001 is constituted by plural photoelectric conversion modules 1000 (Embodiment 5).

In general, a function called a "home energy management system (HEMS)" can be added to the solar power generation system 2000. As a result, the system can monitor use of power on an individual room basis and contribute to energy conservation on an individual house basis.

The junction box 2002 is connected to the photoelectric conversion module array 2001. The power conditioner 2003 is connected to the junction box 2002. The distribution board 2004 is connected to the power conditioner 2003 and an electrical appliance 2011. The power meter 2005 is connected to the distribution board 2004 and to an interconnected system.
<Operation>

The operation of the solar power generation system 2000 of Embodiment 6 is, for example, as follows.

The photoelectric conversion module array 2001 converts sunlight into electricity to generate DC power and supplies DC power to the junction box 2002.

The junction box 2002 receiving the DC power generated by the photoelectric conversion module array 2001 supplies the DC power to the power conditioner 2003.

The power conditioner 2003 converts DC power supplied from the junction box 2002 into AC power and supplies AC power to the distribution board 2004. Alternatively, part of the DC power supplied from the junction box 2002 may remain unconverted and be supplied to the distribution board 2004 as is.

The distribution board 2004 supplies to the electrical appliance 2011 at least one of the AC power supplied from the power conditioner 2003 and the commercial power supplied through the power meter 2005. If the AC power supplied from the power conditioner 2003 is larger than the power consumed by the electrical appliance 2011, the distribution board 2004 supplies to the electrical appliance 2011 the AC power supplied from the power conditioner 2003. The excess AC power is supplied to the interconnected system through the power meter 2005.

When the AC power supplied to the distribution board 2004 from the power conditioner 2003 is smaller than the power consumed by the electrical appliance 2011, the distribution board 2004 supplies to the electrical appliance 2011 AC power supplied from the interconnected system and AC power supplied from the power conditioner 2003.

The power meter 2005 measures the power that flows from the interconnected system to the distribution board 2004 and the power that flows from the distribution board 2004 to the interconnected system.
<Photoelectric Conversion Module Array>

The photoelectric conversion module array 2001 will now be described.

Figure 24:
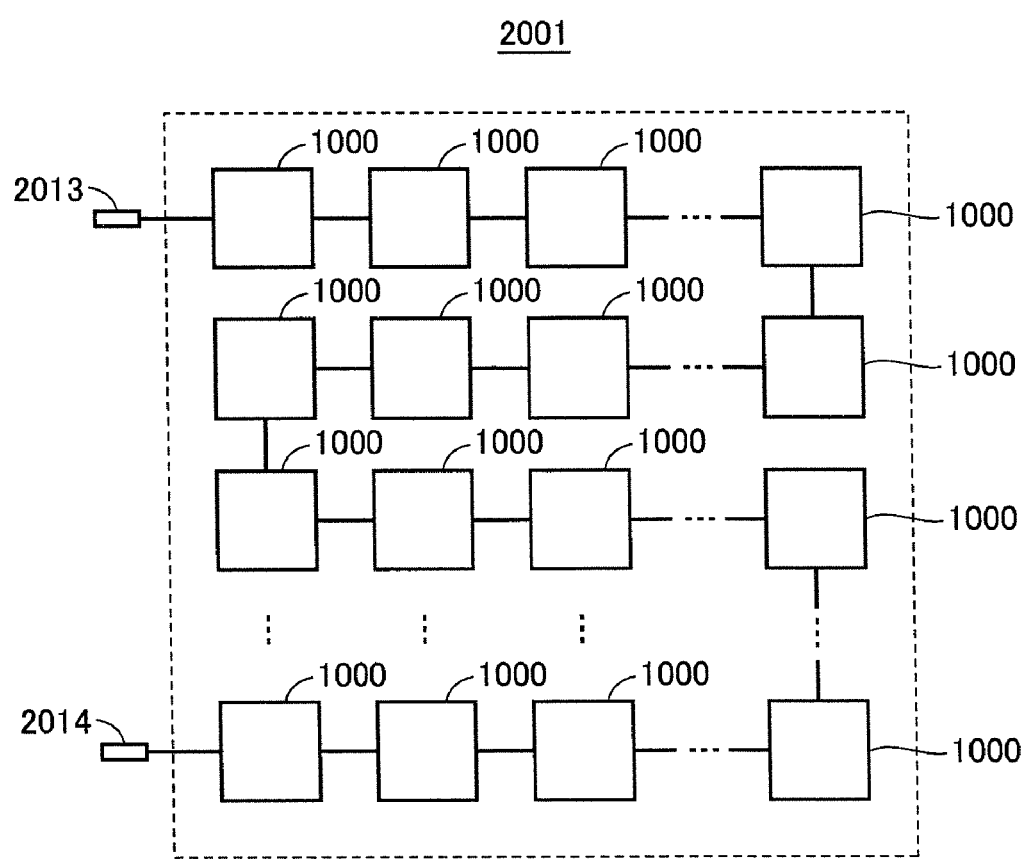
FIG. 24 is a schematic diagram of an example of an array structure of a photoelectric conversion module illustrated in FIG. 23.

FIG. 24 is a schematic diagram illustrating an example of a structure of the photoelectric conversion module array 2001 illustrated in FIG. 23. Referring to FIG. 24, the photoelectric conversion module array 2001 includes plural photoelectric conversion modules 1000 and output terminals 2013 and 2014.

The photoelectric conversion modules 1000 are arranged into an array and connected in series. FIG. 24 illustrates an arrangement in which the photoelectric conversion modules 1000 are connected in series but the arrangement and the connection mode are not limited to these. The modules may be connected in parallel or both in series and in parallel. The number of the photoelectric conversion modules 1000 included in the photoelectric conversion module array 2001 can be any integer equal to or greater than 2.

The output terminal 2013 is connected to the photoelectric conversion module 1000 located at one end of the photoelectric conversion modules 1000 connected in series.

The output terminal 2014 is connected to the photoelectric conversion module 1000 located at the other end of the photoelectric conversion modules 1000 connected in series.

The description above is merely exemplary and the solar power generation system of Embodiment 6 may have any structure not limited by the description above as long as at least one of heterojunction-type back-contact cells of Embodiments 1 to 4 is included.

Embodiment 7

Embodiment 7 is a solar power generation system whose scale is larger than that of the solar power generation system described in Embodiment 6. The solar power generation system of Embodiment 7 also includes at least one of heterojunction-type back-contact cells of Embodiments 1 to 4.

<Large-Scale Solar Power Generation System>

Figure 25:
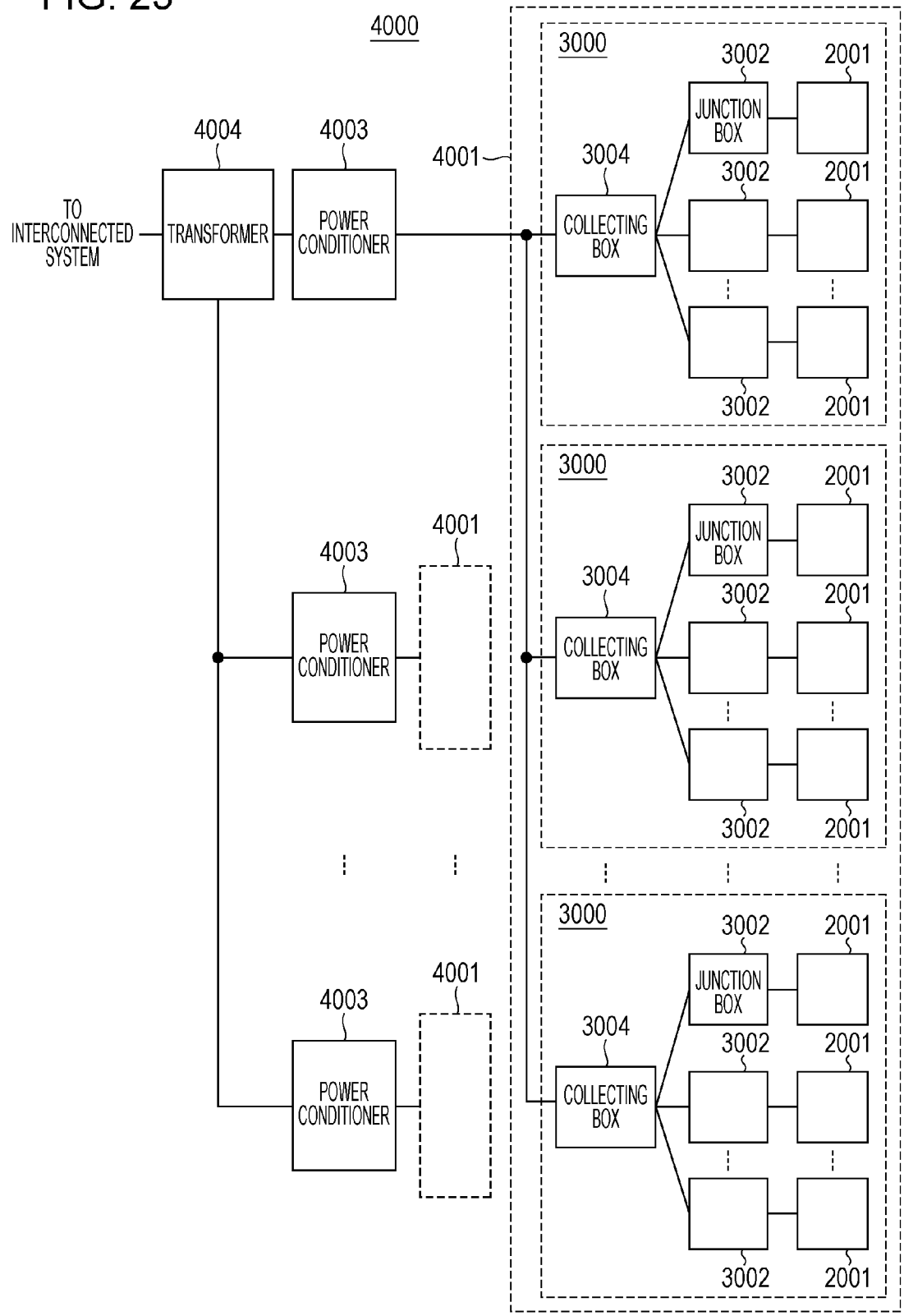
FIG. 25 is a schematic diagram of a structure of a solar power generation system of Embodiment 7.

FIG. 25 is a schematic diagram illustrating a structure of a solar power generation system of Embodiment 7 which is an example of a large-scale solar power generation system of the present invention. Referring to FIG. 25, a solar power generation system 4000 of Embodiment 7 includes plural subsystems 4001, plural power conditioners 4003, and a transformer 4004. The scale of the solar power generation system 4000 is larger than the scale of the solar power generation system 2000 of Embodiment 6 illustrated in FIG. 24.

The power conditioners 4003 are respectively connected to the subsystems 4001. In the solar power generation system 4000, the number of power conditioners 4003 and the number of subsystems 4001 connected to the power conditioners 4003 may each be any integer equal to or greater than 2.

The transformer 4004 is connected to the power conditioners 4003 and the interconnected system.

Each of the subsystems 4001 is constituted by plural module systems 3000. The number of module systems 3000 in each subsystem 4001 may be any integer equal to or greater than 2.

Each of the module systems 3000 includes plural photoelectric conversion module arrays 2001, plural junction boxes 3002, and a collecting box 3004. The number of the junction boxes 3002 and the number of photoelectric conversion module arrays 2001 connected to the junction boxes 3002 in the module system 3000 may be any integer equal to or greater than 2.

The collecting box 3004 is connected to the junction boxes 3002. The power conditioner 4003 is connected to the collecting boxes 3004 in the subsystems 4001.

<Operation>

The operation of the solar power generation system 4000 of Embodiment 7 is, for example, as follows.

The photoelectric conversion module arrays 2001 in the module system 3000 convert sunlight into electricity to generate DC power and supplies the DC power to the collecting box 3004 via the junction boxes 3002. The collecting boxes 3004 in the subsystem 4001 supply DC power to the power conditioner 4003. The power conditioners 4003 convert the DC power into AC power and supply AC power to the transformer 4004.

The transformer 4004 converts the voltage level of the AC power supplied from the power conditioners 4003 and supplies power to the interconnected system.

The solar power generation system 4000 needs to include at least one of the heterojunction-type back-contact cells of Embodiments 1 to 4 and not all of the photoelectric conversion elements in the solar power generation system 4000 need to be the heterojunction-type back-contact cells of Embodiments 1 to 4. For example, it is possible that all of the photoelectric conversion elements in a particular subsystem 4001 are heterojunction-type back-contact cells of Embodiments 1 to 4 while some or all of the photoelectric conversion elements in another subsystem 4001 are not heterojunction-type back-contact cells of Embodiments 1 to 4.

Example 1

Figure 19:
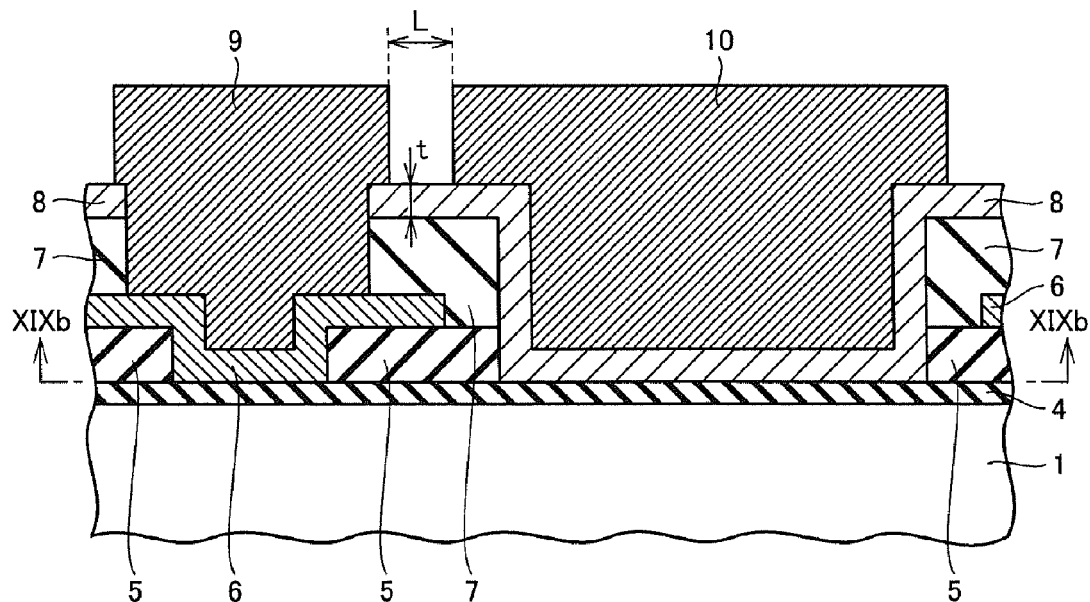
FIG. 19(a) illustrates a cross-sectional structure of a heterojunction-type back-contact cell of Example 1 and FIG. 19(b) is a schematic cross-sectional view taken along XIXb-XIXb in (a).
Figure 19:
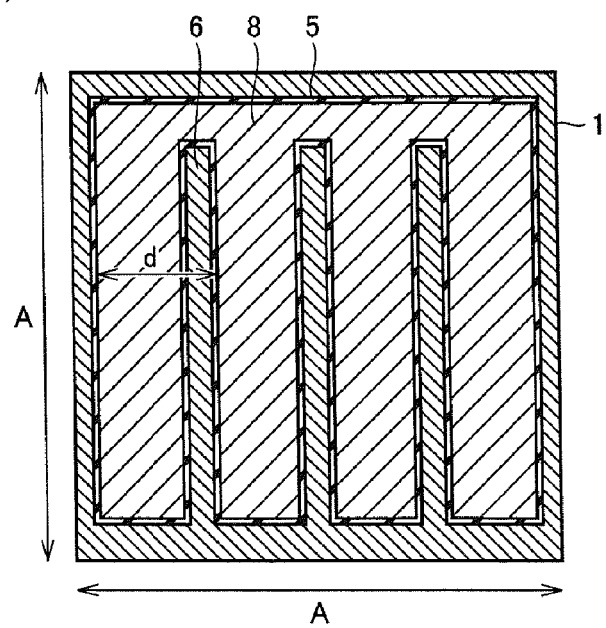

FIG. 19(a) illustrates a cross-sectional structure of a heterojunction-type back-contact cell of Example 1 and FIG. 19(b) is a schematic cross-sectional view taken along XIXb-XIXb of FIG. 19(a). In FIG. 19(a), L represents the interelectrode distance between the first electrode 9 and the second electrode 10 and t represents the thickness of the p-type layer 8. In FIG. 19(b), A represents the length of one side of the heterojunction-type back-contact cell of Example 1 in plan and d represents the electrode pitch.

The interelectrode leak current $I_{leak}$ satisfies the relationship of formula (I) below with respect to operation voltage $V_{op}$, resistance R, operation current $I_{op}$, and allowable rate α for interelectrode leak current:

[Math. 1]

$$I_{leak} = \frac{V_{op}}{R} \leq I_{op}\alpha \quad (I)$$

The resistance R satisfies the relationship of formula (II) below with respect to the interelectrode distance L, the conductivity σ of the p-type layer 8, the thickness t of the p-type layer 8, the length A of one side of the cell in plan, and the electrode pitch d:

[Math. 2]

$$R \approx \frac{L}{\sigma t\{2A(A/d) + 2A\}} = \frac{L}{2A(A/d + 1)\sigma t} \quad (II)$$

It is derived from formula (I) and formula (II) that the interelectrode distance L between the first electrode 9 and the second electrode 10 satisfies the relationship of formula (III) below:

[Math. 3]

$$L \geq \frac{2A(A/d + 1)\sigma t V_{op}}{\alpha I_{op}} \quad (III)$$

Accordingly, for example, when t=10 nm, $V_{op}$=0.7 V, $I_{op}$=40 mA/cm², α=0.01, A=10 cm, d=1 mm, and σ=1×10⁻⁴ S/cm, formula (III) finds that the interelectrode distance L needs to satisfy the relationship L>3.6 nm.

In the case where the p-type layer 8 and the n-type layer 6 are exchanged and the conductivity σ of the n-type layer 6 is 1×10⁻² S/cm, formula (III) finds that the interelectrode distance L needs to satisfy the relationship L>360 nm.

It is derived from formula (III) that the conductivity σ of the p-type layer 8 satisfies the relationship of formula (IV) below:

[Math. 4]

$$\sigma \leq \frac{\alpha I_{op} L}{2A(A/d + 1)tV_{op}} \quad (IV)$$

Accordingly, for example, when t=10 nm, $V_{op}$=0.7 V, $I_{op}$=40 mA/cm², α=0.01, A=10 cm, and d=1 mm, formula (IV) finds that the conductivity σ of the p-type layer 8 needs to satisfy the relationship σ≤2.8×10⁻¹ S/cm in order for L to satisfy L≤10 μm. In the case where the p-type layer 8 and the n-type layer 6 are exchanged, the conductivity σ of the n-type layer 6 needs to satisfy the relationship σ≤2.8×10⁻¹ S/cm.

Example 2

Figure 20:
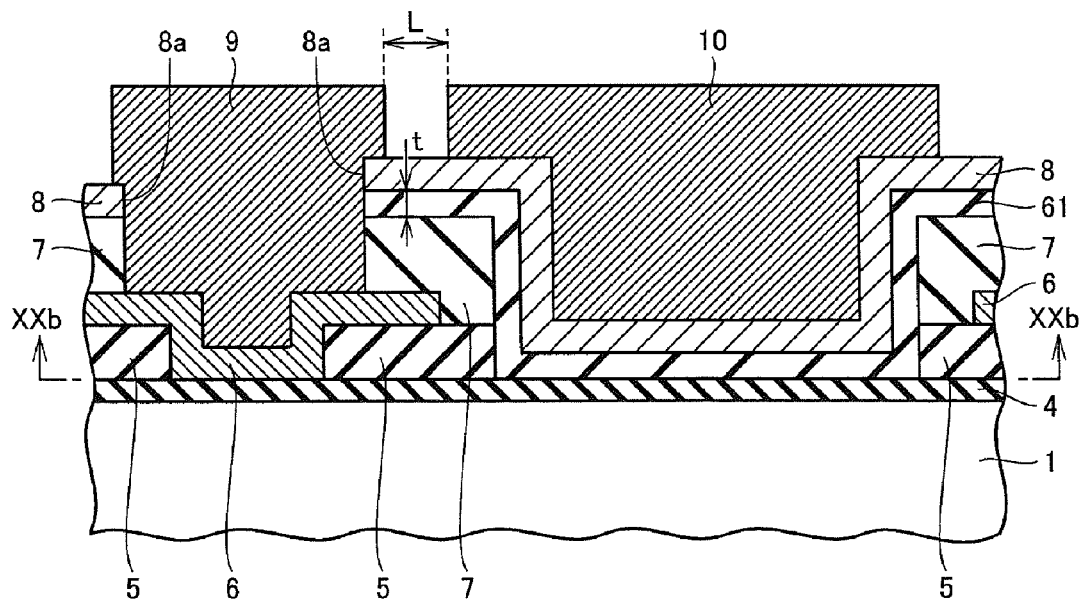
Figure 20:
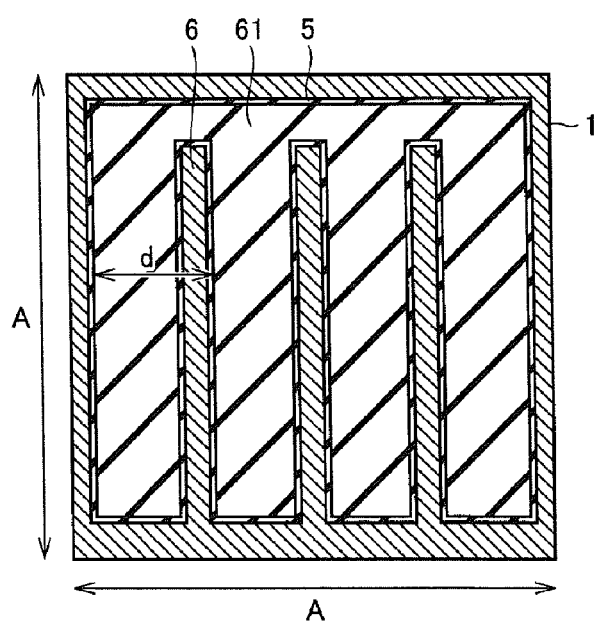
Figure 21:
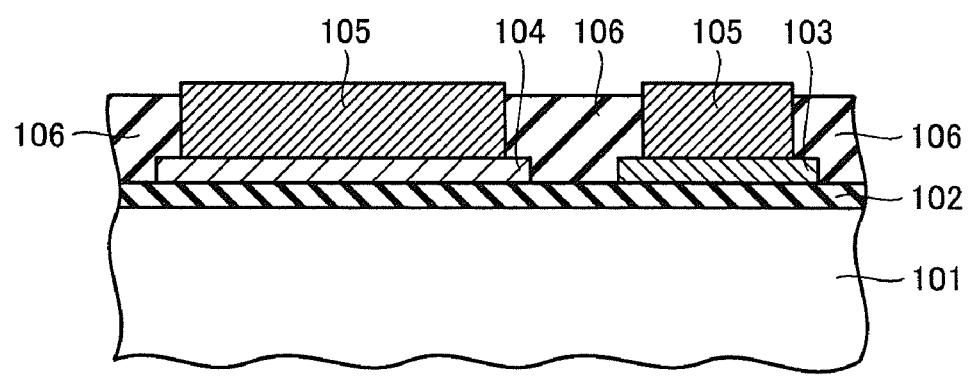
FIG. 21 is a schematic cross-sectional view of an amorphous/crystalline silicon heterojunction device described in PTL 1.

FIG. 20(*a*) illustrates a cross-sectional structure of a heterojunction-type back-contact cell of Example 2. FIG. 20(*b*) is a schematic cross-sectional view taken along XXb-XXb in FIG. 20(*a*). The heterojunction-type back-contact cell of Example 2 differs from the heterojunction-type back-contact cell of Example 1 in that an intrinsic layer 61 containing i-type hydrogenated amorphous silicon is disposed directly below the p-type layer 8. In other words, in the heterojunction-type back-contact cell of Example 2, the end portion 8*a* of the p-type layer 8 is located above the insulating film 7.

In the heterojunction-type back-contact cell of Example 2, the thickness of the intrinsic layer directly below the n-type layer 6 and the thickness of the intrinsic layer directly below the p-type layer 8 can be independently controlled. Thus, a heterojunction-type back-contact cell having enhanced properties such as conversion efficiency can be more easily manufactured.

In particular, when the intrinsic layer directly below the n-type layer 6 is thin, the parasitic resistance can be decreased without substantially decreasing the minority carrier lifetime in the intrinsic layer 4. Meanwhile, when the intrinsic layer directly below the p-type layer 8 is thick, the minority carrier lifetime in the intrinsic layer can be increased. Accordingly, properties such as conversion efficiency can be enhanced by making the thickness of the intrinsic layer directly below the p-type layer 8 (in Example 2, the total thickness of the intrinsic layer 4 and the intrinsic layer 61) larger than the thickness of the intrinsic layer directly below the n-type layer 6 (in Example 2, the thickness of the intrinsic layer 4).

<Overview>

The present invention provides a photoelectric conversion element that includes a semiconductor; an intrinsic layer disposed on the semiconductor and containing hydrogenated amorphous silicon; a first-conductivity-type layer that covers a part of the intrinsic layer and contains hydrogenated amorphous silicon of a first conductivity type; a second-conductivity-type layer that covers a part of the intrinsic layer and contains hydrogenated amorphous silicon of a second conductivity type; an insulating film covering an end region of the first-conductivity-type layer; a first electrode disposed on the first-conductivity-type layer; and a second electrode disposed on the second-conductivity-type layer, in which an end portion of the second-conductivity-type layer is located on the insulating film or above the insulating film. According to this structure, patterning of the second-conductivity-type layer can be conducted over the insulating film and the damage on the semiconductor, the intrinsic layer, and the first-conductivity-type layer inflicted during patterning of the second-conductivity-type layer can be decreased. Moreover, since the first-conductivity-type layer and the second-conductivity-type layer are insulated from each other in the thickness direction, shunt current can be significantly decreased. Thus, the photoelectric conversion element of the present invention can be manufactured in high yield and can exhibit enhanced properties.

The photoelectric conversion element of the present invention preferably further includes an insulating layer that covers a part of the intrinsic layer and an end portion of the first-conductivity-type layer and the end portion of the second-conductivity-type layer are preferably located above a region where the intrinsic layer contacts the insulating layer. According to this structure, patterning of the first-conductivity-type layer can be conducted over the insulating layer and damage on the semiconductor and the intrinsic layer inflicted during patterning of the first-conductivity-type layer can be decreased.

In the photoelectric conversion element of the present invention, an end portion of the first electrode and an end portion of the second electrode are preferably located above the insulating layer. According to this structure, patterning of the first electrode and the second electrode can be conducted over the insulating layer and thus damage on the semiconductor, the intrinsic layer, the first-conductivity-type layer, and the second-conductivity-type layer inflicted during patterning of the first electrode and the second electrode can be decreased. Moreover, in such a case, the interelectrode distance between the first electrode and the second electrode can be decreased, the amount of light passing through the gap between the first electrode and the second electrode can be decreased, and the amount of light reflected toward the semiconductor side can be increased. Thus, properties of the photoelectric conversion element can be improved.

In the photoelectric conversion element of the present invention, an end portion of the first electrode and an end portion of the second electrode are preferably located on the second-conductivity-type layer on the insulating layer. According to this structure, patterning of the first electrode and the second electrode can be conducted over the insulating layer and thus damage on the semiconductor, the intrinsic layer, the first-conductivity-type layer, and the second-conductivity-type layer inflicted during patterning of the first electrode and the second electrode can be decreased. In such a case, the interelectrode distance between the first electrode and the second electrode can be decreased, the amount of light passing through the gap between the first electrode and the second electrode can be decreased, and the amount light reflected toward the semiconductor side can be increased. Thus, the properties of the photoelectric conversion element can be improved.

In the photoelectric conversion element of the present invention, the conductivity of the second-conductivity-type layer is preferably 0.28 S/cm or less. According to this structure, the interelectrode distance between the first electrode and the second electrode can be decreased to 10 μm or less. Thus, the amount of light passing through the gap between the first electrode and the second electrode can be decreased, and the amount light reflected toward the semiconductor side can be increased. Thus, the properties of the photoelectric conversion element can be improved.

In the photoelectric conversion element of the present invention, the second conductivity type is preferably a p-type. According to this structure, a satisfactory passivation effect can be obtained at a surface of a semiconductor by the intrinsic layer.

In the photoelectric conversion element of the present invention, a thickness of the intrinsic layer in a region that contacts the second-conductivity-type layer is preferably larger than a thickness of the intrinsic layer in a region that contacts the first-conductivity-type layer. According to this structure, a satisfactory passivation effect can be obtained at a surface of a semiconductor by the intrinsic layer.

While embodiments and examples of the present invention have been described above, appropriately combining the features of the embodiments and examples described above is also anticipated from the beginning.

The embodiments and examples disclosed herein are merely illustrative in all aspects and should not be considered as limiting. The scope of the present invention is to be defined not by the description above but by the claims and is intended to cover all modifications within the scope of the claims and equivalents thereof.

INDUSTRIAL APPLICABILITY

The present invention is applicable to photoelectric conversion elements and methods for manufacturing photoelectric conversion elements, in particular, to a heterojunction-type back-contact cell and a method for manufacturing a heterojunction-type back-contact cell.

REFERENCE SIGNS LIST 1 semiconductor
2 texture structure
3 antireflection film
4 intrinsic layer
5 insulating layer
6 n-type layer
6a end portion
6b groove portion
6c flap portion
7 insulating film
8 p-type layer
8a end portion
8b groove portion
8c flap portion
9 first electrode
9a end portion
10 second electrode
10a end portion
21 resist
22 opening
31 resist
32 opening
41 resist
42 opening
51 resist
52 opening
61 intrinsic layer
71 resist
72 opening
81 resist
82 opening
101 crystalline silicon wafer
102 hydrogenated amorphous silicon transition layer
103 n-doped region
104 p-doped region
105 electrode
106 reflecting layer
1000 photoelectric conversion module
1001 photoelectric conversion element
1002 cover
1013, 1014 output terminal
2000 solar power generation system
2001 photoelectric conversion module array
2002 junction box
2003 power conditioner
2004 distribution board
2005 power meter
2011 electrical appliance
2013, 2014 output terminal
3000 module system
3002 junction box
3004 collecting box
4000 solar power generation system
4001 subsystem
4003 power conditioner
4004 transformer

The invention claimed is:

1. A photoelectric conversion element comprising:
a semiconductor;
an intrinsic layer extending continuously along a back surface of the semiconductor and containing hydrogenated amorphous silicon;
a first-conductivity-type layer that directly covers a portion of the intrinsic layer and contains hydrogenated amorphous silicon of a first conductivity type;
a second-conductivity-type layer that directly covers a portion of the intrinsic layer and contains hydrogenated amorphous silicon of a second conductivity type;
an insulating film directly covering an end region of the first-conductivity-type layer and not contacting the intrinsic layer;
a first electrode on the first-conductivity-type layer; and
a second electrode on the second-conductivity-type layer, wherein
an end portion of the second-conductivity-type layer is on the insulating film or above the insulating film, and
a surface of the intrinsic layer which is opposite to a surface of the intrinsic layer in contact with the first-conductivity-type layer and a surface of the intrinsic layer which is opposite to a surface of the intrinsic layer in contact with the second-conductivity-type layer are in a same plane as the semiconductor.

2. The photoelectric conversion element according to claim 1, further comprising:
an insulating layer that covers a portion of the intrinsic layer,
wherein an end portion of the first-conductivity-type layer and the end portion of the second-conductivity-type layer are located above a region where the intrinsic layer contacts the insulating layer.

3. The photoelectric conversion element according to claim 2, wherein an end portion of the first electrode and an end portion of the second electrode are located above the insulating layer.

4. The photoelectric conversion element according to claim 1, wherein the second conductivity type is a p-type.

5. The photoelectric conversion element according to claim 1, wherein a thickness of the intrinsic layer in a region that contacts the second-conductivity-type layer is larger than a thickness of the intrinsic layer in a region that contacts the first-conductivity-type layer.

6. The photoelectric conversion element according to claim 2, wherein the insulating layer contacts a portion of a surface of the intrinsic layer that is positioned distally away from the semiconductor.

7. The photoelectric conversion element according to claim 1, wherein the insulating film contacts a surface of an end region of the first-conductivity-type layer that is positioned distally away from the semiconductor.

8. The photoelectric conversion element according to claim 1, wherein the end portion of the first-conductivity-type layer is directly covered by the insulating film.

9. The photoelectric conversion element according to claim 1, wherein an end portion of the first electrode and an end portion of the second electrode are located above the insulating film.

10. The photoelectric conversion element according to claim 9, wherein the end portion of the first electrode and the end portion of the second electrode are located on a portion of the second-conductivity type layer that is located on the insulating film.

11. The photoelectric conversion element according to claim 2, wherein the end portion of the first electrode is located on a portion of the first-conductivity-type layer that is located on the insulating layer, and
the end portion of the second electrode is located on the second-conductive type layer that located on the insulating film or above the insulating film.

12. The photoelectric conversion element according to claim 8, wherein the insulating layer is directly covered by the end region of first-conductivity-type layer and the insulating film, and the end of the second-conductivity-type layer directly covers the insulating film;
an end portion of the first-conductivity-type layer is surrounded by the insulating film and the insulating layer.

* * * * *